(12) United States Patent
Muto et al.

(10) Patent No.: US 10,519,566 B2
(45) Date of Patent: Dec. 31, 2019

(54) WAFER SUPPORT, CHEMICAL VAPOR PHASE GROWTH DEVICE, EPITAXIAL WAFER AND MANUFACTURING METHOD THEREOF

(71) Applicant: SHOWA DENKO K.K., Minato-ku, Tokyo (JP)

(72) Inventors: Daisuke Muto, Chichibu (JP); Jun Norimatsu, Yokohama (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/233,390

(22) Filed: Dec. 27, 2018

(65) Prior Publication Data

US 2019/0127879 A1    May 2, 2019

Related U.S. Application Data

(62) Division of application No. 15/531,593, filed as application No. PCT/JP2015/083377 on Nov. 27, 2015, now Pat. No. 10,208,398.

(30) Foreign Application Priority Data

Dec. 2, 2014    (JP) .................. 2014-243939
Dec. 19, 2014    (JP) .................. 2014-257833

(51) Int. Cl.
*H01L 21/02*    (2006.01)
*C30B 25/20*    (2006.01)
(Continued)

(52) U.S. Cl.
CPC ............ *C30B 25/20* (2013.01); *C23C 16/325* (2013.01); *C23C 16/4581* (2013.01);
(Continued)

(58) Field of Classification Search
CPC ............................ H01L 21/02; H01L 21/687
See application file for complete search history.

(56) References Cited

U.S. PATENT DOCUMENTS 5,458,918 A    10/1995   Hawkins et al.
5,645,646 A    7/1997    Beinglass et al.
(Continued)

FOREIGN PATENT DOCUMENTS

EP    0451855 A1    10/1991
JP    2-174114 A    7/1990
(Continued)

OTHER PUBLICATIONS

Communication dated May 15, 2018, from Japanese Patent Office in counterpart application No. 2014-243939.
(Continued)

*Primary Examiner* — Thao P Le
(74) *Attorney, Agent, or Firm* — Sughrue Mion, PLLC

(57) ABSTRACT

Provided is a manufacturing device capable of effectively and sufficiently reducing an edge crown. The wafer support is used in a chemical vapor phase growth device in which an epitaxial film is grown on a main surface of a wafer using a chemical vapor deposition method, the wafer support including: a wafer mounting surface having an upper surface on which a substrate is mounted; and a wafer support portion that rises to surround a wafer to be mounted, in which a height from an apex of the wafer support portion to a main surface of the wafer mounted on the wafer mounting surface is 1 mm or more.

2 Claims, 11 Drawing Sheets

(51) Int. Cl.
*C30B 25/12* (2006.01)
*C30B 29/36* (2006.01)
*C23C 16/32* (2006.01)
*C23C 16/458* (2006.01)
*H01L 29/16* (2006.01)
*C30B 25/16* (2006.01)
*C23C 16/455* (2006.01)
*H01L 21/687* (2006.01)

(52) U.S. Cl.
CPC ...... *C23C 16/4584* (2013.01); *C23C 16/4585* (2013.01); *C23C 16/45504* (2013.01); *C30B 25/12* (2013.01); *C30B 25/165* (2013.01); *C30B 29/36* (2013.01); *H01L 21/0262* (2013.01); *H01L 21/02378* (2013.01); *H01L 21/02433* (2013.01); *H01L 21/02529* (2013.01); *H01L 21/68721* (2013.01); *H01L 21/68735* (2013.01); *H01L 21/68764* (2013.01); *H01L 21/68771* (2013.01); *H01L 29/1608* (2013.01); *H01L 21/02634* (2013.01)

(56) References Cited

U.S. PATENT DOCUMENTS

| | | | |
|---|---|---|---|
| 5,705,042 A | 1/1998 | Leiphart et al. | |
| 6,197,121 B1* | 3/2001 | Gurary | C23C 16/45514 118/715 |
| 8,062,958 B2 | 11/2011 | Wood et al. | |
| 2003/0056718 A1* | 3/2003 | Kawahara | C30B 25/18 117/84 |
| 2004/0246610 A1* | 12/2004 | Tsuno | G02B 5/08 359/883 |
| 2007/0212816 A1 | 9/2007 | Nishimura | |
| 2007/0218664 A1 | 9/2007 | Ito et al. | |
| 2007/0264444 A1 | 11/2007 | Otsuki et al. | |
| 2008/0070032 A1 | 3/2008 | Otsuki | |
| 2010/0029066 A1 | 2/2010 | Miyashita | |
| 2011/0312162 A1 | 12/2011 | Iacopi | |
| 2014/0230722 A1* | 8/2014 | Kageshima | C30B 29/36 117/88 |
| 2014/0264384 A1 | 9/2014 | Loboda et al. | |
| 2014/0283746 A1* | 9/2014 | Seo | C23C 16/505 118/723 R |
| 2014/0360430 A1 | 12/2014 | Armour et al. | |
| 2015/0222087 A1 | 8/2015 | Williams et al. | |
| 2017/0327970 A1* | 11/2017 | Muto | C30B 25/12 |

FOREIGN PATENT DOCUMENTS

| | | |
|---|---|---|
| JP | 4-354119 A | 12/1992 |
| JP | 6-310438 A | 11/1994 |
| JP | 6-310442 A | 11/1994 |
| JP | 7-226349 A | 8/1995 |
| JP | 10-150095 A | 6/1998 |
| JP | 10-163117 A | 6/1998 |
| JP | 2003-12397 A | 1/2003 |
| JP | 2006-290706 A | 10/2006 |
| JP | 2009-164162 A | 7/2009 |
| JP | 2013-38153 A | 2/2013 |
| JP | 2014-27006 A | 2/2014 |
| JP | 2014-27028 A | 2/2014 |
| JP | 2014-127612 A | 7/2014 |
| WO | 2015/044748 A1 | 4/2015 |

OTHER PUBLICATIONS

International Search Report for PCT/JP2015/083377, dated Mar. 1, 2016 (PCT/ISA/210).
Non-Final Office Action dated Apr. 6, 2018, in parent U.S. Appl. No. 15/531,593, 11 pages.
Notice of Allowance dated Oct. 24, 2018, in parent U.S. Appl. No. 15/531,593, 11 pages.
Communication dated Jul. 2, 2019, from The Patent Office of The People's Republic of China in counterpart Application No. 201580065143.3.
Communication dated Jul. 2, 2019, from the Japanese Patent Office in counterpart Application No. 2015-246723.

* cited by examiner

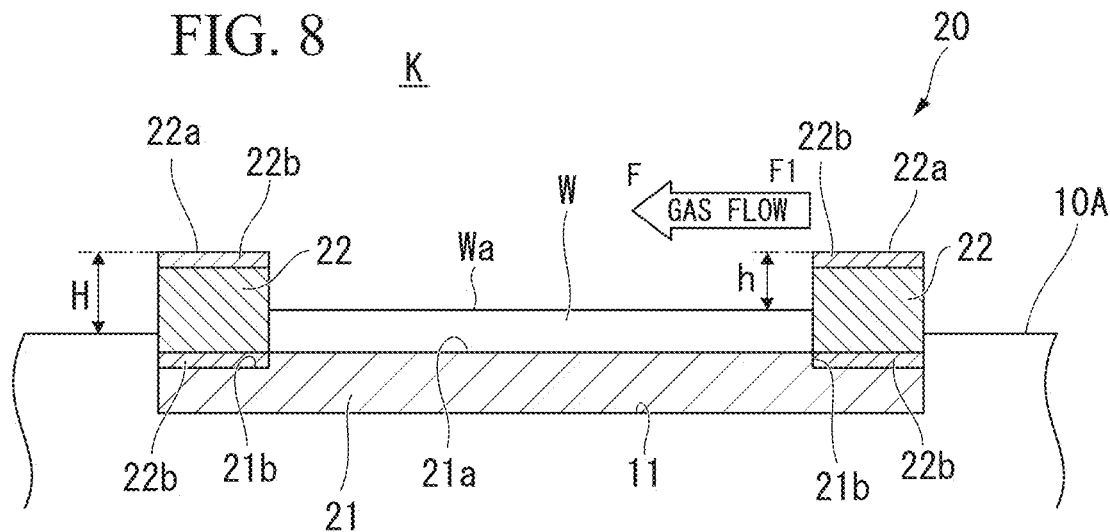
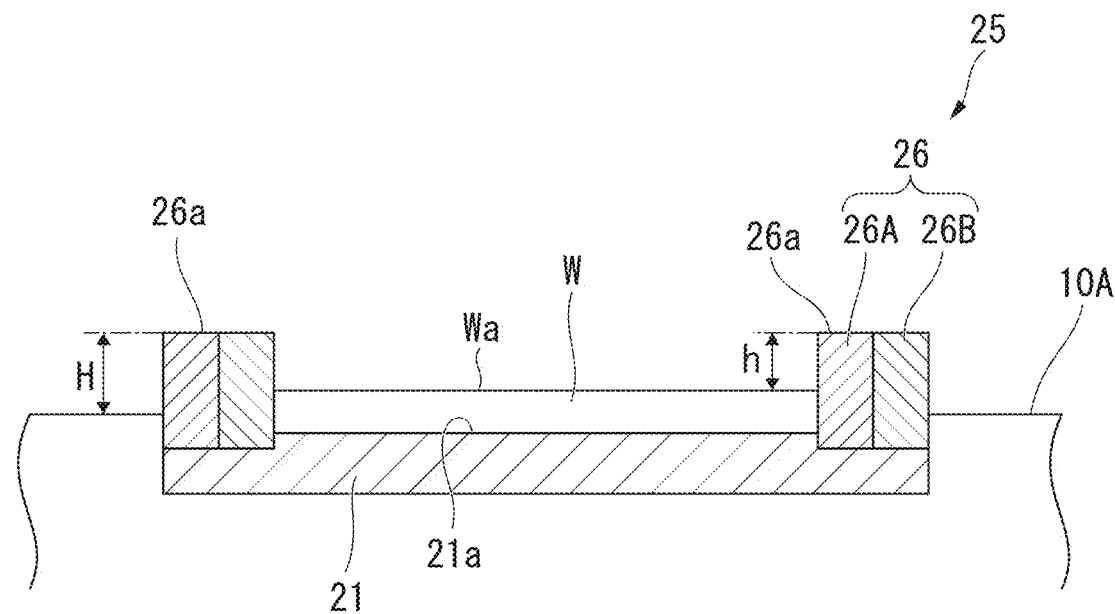

WAFER SUPPORT, CHEMICAL VAPOR PHASE GROWTH DEVICE, EPITAXIAL WAFER AND MANUFACTURING METHOD THEREOF

CROSS REFERENCE TO RELATED APPLICATIONS

This application is a divisional of application Ser. No. 15/531,593, filed May 30, 2017, which is a National Stage of International Application No. PCT/JP2015/083377, filed Nov. 27, 2015, claiming priority based on Japanese Patent Application No. 2014-243939, filed Dec. 2, 2014, and Japanese Patent Application No. 2014-257833, filed Dec. 19, 2014, the contents of all of which are incorporated herein by reference in their entirety.

TECHNICAL FIELD

The present invention relates to a wafer support, a chemical vapor phase growth device, an epitaxial wafer, and a manufacturing method thereof.

Priority is claimed on Japanese Patent Application No. 2014-243939, filed Dec. 2, 2014 and Japanese Patent Application No. 2014-257833, filed Dec. 19, 2014, the contents of which are incorporated herein by reference.

BACKGROUND ART

As means for forming a thin film on a substrate, for example, various film forming methods such as a sputtering method, a vacuum deposition method, or a chemical vapor deposition (CVD) method are generally used.

In a case where a chemical vapor deposition method is used, a high-quality film can be formed. In a case where the thickness and composition of a film to be formed, the concentrations of impurities to be added, and the like vary, the performance of a semiconductor device or the like changes. Therefore, in particular, a high-quality film is required, and as a method of forming such a semiconductor layer, a chemical vapor deposition method is generally used.

For example, as a substrate for forming a SiC epitaxial film in a SiC epitaxial wafer, a SiC single-crystal substrate which is obtained by processing bulk SiC single crystal prepared using a sublimation method is used. Typically, a SiC epitaxial film which forms an active region of a SiC semiconductor device is grown on the SiC single-crystal substrate using a chemical vapor deposition (CVD) method.

In a manufacturing process of the epitaxial wafer, smoothing a surface of the epitaxial wafer has been an issue for a long time. In order to increase the effective area of a wafer, it is not only required to increase the size of a wafer but also to reduce an edge exclusion zone (ineffective region surrounding a semiconductor wafer; typically, expressed by the distance from an edge).

In a case where the edge exclusion zone can be reduced, the effective area ratio which can be achieved in a semiconductor chip can be increased, and thus the yield of the semiconductor chip can be improved. Therefore, recently, it has been required to further reduce the width of the edge exclusion zone.

However, during crystal growth, even in a case where a wafer is mounted in a space under the same conditions, it is observed that the growth rate varies between the center and an outer peripheral portion of the wafer. It is known that, in a case where a single-crystal wafer is epitaxially grown, the formation of a so-called edge crown in which an outer peripheral portion of a wafer thickens occurs. This edge crown is required to be removed because it increases the width of the edge exclusion zone.

Here, "increasing the width of the edge exclusion zone" does not represent that the width increases merely due to a difference in the thickness of an outer peripheral portion in which an edge crown is formed. For example, in a case where an edge crown is formed on an upstream side of a step flow, this edge crown interferes with uniform gas supply. Therefore, in an epitaxial film of an epitaxial wafer, defects may occur due to various transfers or the like, and the presence of these defects may also cause an increase in the width of the edge exclusion zone.

In addition, this edge crown may break during transport and damage an epitaxial surface of a wafer, or may cause cracking during processing. Therefore, the edge crown is required to be removed.

In the related art, in order to remove an edge crown, an outer peripheral portion of a wafer is removed in advance during the growth of an edge crown so as to prevent the outer peripheral portion of the epitaxial wafer from thickening (for example, PTL 1). In addition, a formed edge crown is removed after epitaxial growth (for example, PTL 2).

In addition, in a chemical vapor phase growth device, typically, a wafer (substrate) on which an epitaxial film is grown is disposed in the center of a concave portion (for example, a countersunk portion) provided in a susceptor (substrate support member). At this time, generally, a difference in level between a wafer surface and a susceptor surface is reduced in order to prevent this difference from interfering with the gas flow (for example, PTL 3). To that end, during silicon epitaxial growth, the depth of the concave portion of the susceptor also changes depending on the thickness of a silicon wafer so as to reduce a difference in level between an upper surface of the susceptor and an upper surface of the silicon wafer (PTL 4).

CITATION LIST

Patent Literature

[PTL 1] Japanese Unexamined Patent Application, First Publication No. H7-226349

[PTL 2] Japanese Unexamined Patent Application, First Publication No. 2014-27006

[PTL 3] Japanese Unexamined Patent Application, First Publication No. H4-354119

[PTL 4] Japanese Unexamined Patent Application, First Publication No. 2003-12397

SUMMARY OF INVENTION

Technical Problem

However, for example, in the method of removing a part of an outer peripheral portion of a wafer in advance as disclosed in PTL 1, it is necessary that the outer peripheral portion is removed in consideration of the thickness of an epitaxial film to be formed and the thickness of an edge crown to be formed during the formation of the epitaxial film, and this wafer is used only for forming an epitaxial film having a specific thickness. In the real production field, generally, an epitaxial film to be grown changes depending on the intended use and conditions, and the use of a wafer dedicated to specific film forming conditions causes a significant deterioration in production efficiency.

In addition, for example, in a case where an edge crown is removed after the growth of an epitaxial film as disclosed in PTL 2, a region near the removed edge crown is scraped by polishing. Therefore, there is a problem in that the epitaxial film is roughened due to damages during polishing. A semiconductor device laminated on the polished surface has poor performance and thus cannot be used as a product. That is, a reduction in the width of the edge exclusion zone for the purpose of removing an edge crown cannot be achieved.

In either method, there is a problem in that a large number of man-hours are required to remove an edge crown. In addition, cracking is likely to occur due to this processing, and thus there is a problem in that the yield also decreases. In particular, in the case of a SiC epitaxial wafer, SiC is an extremely hard material, and thus it is more difficult to remove an edge crown by polishing. Further, there is a problem in that particles and the like produced during polishing are attached to a surface of an epitaxial film and cause defects in a semiconductor device.

As the thickness of an epitaxial film increases, the size of an edge crown increases. Therefore, an edge crown causes a significant problem during the process and is difficult to remove. In particular, in the case of SiC, a thick epitaxial film is necessary in order to manufacture a high-voltage device and causes a more severe problem.

Further, recently, a large-diameter SiC wafer has been obtained. In particular, it is difficult to grind a SiC wafer having a diameter of 6 inches or more.

As described above, in the related art, a device in which an edge crown, which is formed when an epitaxial film is grown on a wafer, can be efficiently and sufficiently suppressed has not been sufficiently disclosed. In addition, an epitaxial wafer in which the edge exclusion zone can be sufficiently reduced has also not been sufficiently disclosed.

Therefore, a manufacturing device capable of effectively and sufficiently reducing an edge crown has been eagerly desired.

In addition, during the manufacturing of a SiC epitaxial wafer, a Si-containing gas such as $SiH_4$ and a C-containing raw material gas such as $C_3H_8$ are supplied as a process gas such that the gas flowing from an outer peripheral end portion of a SiC substrate passes through a region above the SiC substrate. At this time, an epitaxial film is grown on a SiC single-crystal substrate by depositing an epitaxial material on the substrate while maintaining the substrate at a high temperature using heating means.

However, when a SiC epitaxial film is grown on a SiC substrate, the carrier concentration in an outer peripheral portion of the SiC epitaxial film, that is, in the vicinity of an edge excessively increases, and there is a problem in that a variation in the in-plane carrier concentration in the SiC epitaxial film increases.

The present inventors repeated a thorough investigation on the reason why the above-described variation in the carrier concentration is likely to be generated. As a result, it was found that the variation is generated because there is a significant difference in decomposition rate between propane ($C_3H_8$) and silane gas ($SiH_4$) which are generally used as a raw material gas of a SiC epitaxial film.

It is known that the decomposition rate of $C_3H_8$ containing carbon is slower than that of $SiH_4$. In addition, when a raw material gas is supplied to a SiC substrate during epitaxial growth, the SiC substrate is rotating. Therefore, an outer peripheral end portion of the SiC substrate approaches a gas introduction port (upstream side of a gas flow). That is, when a SiC epitaxial film is grown along with the supply of the raw material gas, the decomposition of $C_3H_8$ containing carbon is not sufficiently promoted in the vicinity of an outer peripheral portion of a SiC substrate positioned on an upstream side of a gas flow, and the amount of carbon in the growth film decreases. On the other hand, in the vicinity of the center of the substrate positioned on a downstream side of a gas flow, the decomposition of $C_3H_8$ containing carbon is sufficiently promoted. Therefore, the carbon proportion increases as compared to that in the vicinity of the outer peripheral portion.

A C/Si ratio in the raw material gas to be supplied is set assuming that propane ($C_3H_8$) and silane gas ($SiH_4$) are sufficiently decomposed. Therefore, in a case where there is a difference in decomposition rate, the C/Si ratio is lower than that in the outer peripheral portion of the SiC epitaxial film. That is, in the vicinity of the center of the substrate where the decomposition is sufficiently promoted, the in-plane carrier concentration in the SiC epitaxial film is appropriately controlled. On the other hand, in the outer peripheral portion, the C/Si ratio decreases, and thus there is a problem in that the carrier concentration increases.

The phenomenon in which the carrier concentration in the outer peripheral portion increases due to the low C/Si ratio will be described. During SiC epitaxial growth, in general, N is used as a carrier, and this N is selectively introduced into a site occupied by a carbon atom. In a case where the C/Si ratio is low, the amount of carbon in a raw material gas is relatively small. Therefore, N as the carrier is likely to be introduced into a site occupied by carbon in a SiC film which is epitaxially grown. That is, the amount of N as the carrier introduced increases, and thus the carrier concentration increases. Therefore, in the method of the related art, there is a problem in that the carrier concentration in an outer peripheral portion of a SiC epitaxial film increases and thus a variation thereof increases.

Here, in the outer peripheral portion, the amount of carbon is insufficient, and thus the carrier concentration decreases. Therefore, for example, a configuration of increasing the carbon concentration in the raw material gas to increase the C/Si ratio in an outer peripheral portion of a SiC epitaxial film can be considered. However, in a case where only the configuration of increasing the carbon concentration is adopted, the C/Si ratio in the center of a wafer varies, and a difference in carrier concentration between the center and an outer peripheral portion of the wafer cannot be suppressed.

The present invention has been made in consideration of the above-described problems, and an object thereof is to provide a support capable of efficiently and sufficiently reducing an edge crown and uniformizing the in-plane carrier concentration in a wafer, a manufacturing device including the support, and a manufacturing method using the support. In addition, another object of the present invention is to provide an epitaxial wafer in which an edge crown is sufficiently removed such that the effective area ratio which can be achieved in a semiconductor chip is high.

Solution to Problem

As a result of a thorough investigation, the present inventors focused on a positional relationship between a main surface of a wafer and a reaction space side-upper surface of a support member for supporting the wafer during the growth of an epitaxial film. "A main surface of a wafer" refers to a flat surface on which an epitaxial film is formed. In a case where a chamfered portion is formed at an end portion of a substrate wafer, an inclined surface of the chamfered portion is not a main surface.

In a chemical vapor phase growth device, in order not to interrupt a laminar flow supplied into a reaction space, in general, a difference in level between a wafer main surface on which an epitaxial film is grown and a wafer support portion which is formed around the wafer main surface is as little as possible. In addition, even in a case where a difference in level is provided, it is common knowledge to those skilled in the art that the difference in level is suppressed to about several hundreds of micrometers (for example, PTLs 3 and 4).

However, the present inventors found that, during the growth of an epitaxial film, an edge crown can be efficiently and sufficiently reduced by adjusting a difference in level between a portion of a reaction space side-upper surface of a wafer support portion for supporting a wafer and a main surface of the wafer on which an epitaxial film is grown to a value of 1 mm or more, the portion of the reaction space side-upper surface being most distant from a wafer mounting surface, and the value of 1 mm or more not being common knowledge to those skilled in the art. Based on this finding, the present invention has been completed.

That is, in order to achieve the above-described problems, the present invention provides the following means.

(1) According to the present invention, there is provided a wafer support which is used in a chemical vapor phase growth device in which an epitaxial film is grown on a main surface of a wafer using a chemical vapor deposition method, the wafer support including: a wafer mounting surface having an upper surface on which a substrate is mounted; and a wafer support portion that rises to surround a wafer to be mounted, in which a height from a portion of a reaction space side-upper surface of the wafer support portion, which is most distant from the wafer mounting surface, to a main surface of the wafer mounted on the wafer mounting surface is 1 mm or more.

(2) In the wafer support according to (1), the wafer support portion may include the same material as that of the epitaxial film to be formed on the main surface of the wafer.

(3) In the wafer support according to (1), at least a part of the wafer support portion may be formed of a material including some of constituent elements of the epitaxial film.

(4) In the wafer support according to (3), it is preferable that the wafer is a SiC single-crystal substrate, the epitaxial film is a SiC epitaxial film, and at least a part of the wafer support portion is formed of graphite.

(5). In the wafer support according to (3) or (4), it is preferable that the wafer support portion is formed of graphite, a coating layer is formed on at least a part of the wafer support portion, and graphite on a portion of the wafer support portion which is not covered with the coating layer is exposed.

(6) According to the present invention, there is provided a chemical vapor phase growth device including the wafer support according to any one of (1) to (5).

(7) In the chemical vapor phase growth device according to (6), a flow rate of gas which is supplied to the main surface of the wafer mounted on the wafer support may be 0.1 m/s to 10 m/s.

(8) In the chemical vapor phase growth device according to (6) or (7), an interval between the wafer support portion and an outer peripheral surface of the wafer mounted on the wafer mounting surface may be designed to be 0.1 mm to 0.5 mm.

(9) In the chemical vapor phase growth device according to any one of (6) to (8), during growth of the epitaxial film, a growth pressure may be 25 kPa or lower and a growth temperature may be 1400° C. or higher.

(10) The chemical vapor phase growth device according to (6) is a device for manufacturing a SiC epitaxial wafer in which a SiC epitaxial film is grown on a main surface of a SiC substrate using a chemical vapor deposition method, the chemical vapor phase growth device including: a mounting plate that includes a concave holder; and the wafer support that is disposed in the concave holder and has an upper surface on which the SiC substrate is mounted.

(11) In the present invention, it is preferable that a flow rate of gas which is supplied to the main surface of the SiC substrate mounted on the wafer support is 0.1 m/s to 10 m/s.

(12) According to the present invention, there is provided a method of manufacturing a SiC epitaxial wafer in which a SiC epitaxial film is grown on a main surface of a SiC substrate using a chemical vapor deposition method, the method including: forming the SiC epitaxial film on the SiC substrate while forming a flow of a raw material gas, which passes a region above the wafer support portion according to any one of (1) to (5) and reaches the main surface of the SiC substrate, using a chemical vapor phase growth device (device for manufacturing a SiC epitaxial wafer) including a mounting plate that includes a concave holder, and the wafer support that is disposed in the concave holder and has an upper surface on which the SiC substrate is mounted.

(13) In the method according to the present invention, it is preferable that a flow rate of gas which is supplied to the main surface of the SiC substrate mounted on the wafer support is 0.1 m/s to 10 m/s.

(14) According to the present invention, there is provided an epitaxial wafer which is manufactured using the chemical vapor phase growth device according to any one of (6) to (11), the epitaxial wafer including: an epitaxial film that is formed on a main surface of the wafer, in which a height of an edge crown, which is formed on a wafer peripheral portion of the epitaxial film, from a level surface of the epitaxial film is within 30% with respect to a thickness of the epitaxial film at a wafer center.

(15) In the epitaxial wafer according to (14), the thickness of the epitaxial film at the wafer center may be 30 μm or more.

(16) In the epitaxial wafer according to (14) or (15), the epitaxial film may be formed of silicon carbide.

Advantageous Effects of Invention

In the wafer support portion according to the present invention, a height from a portion of a reaction space side-upper surface of the wafer support portion, which is most distant from the wafer mounting surface, to a main surface of the wafer mounted on the wafer mounting surface is 1 mm or more. Therefore, the supply of the raw material gas to an outer peripheral portion of the wafer is suppressed, the growth of an edge crown can be suppressed, and an epitaxial wafer having a small width of the edge exclusion zone and a large effective area can be obtained.

In addition, at least a part of the wafer support includes some of constituent elements of the epitaxial film. Therefore, an element required during the growth of the epitaxial film can be supplied from the wafer support portion, and an epitaxial wafer including the epitaxial film in which a variation in carrier concentration in an in-plane direction is suppressed can be provided.

The chemical vapor phase growth device according to the present invention includes the above-described wafer support portion. Therefore, by using this chemical vapor phase growth device, an edge crown can be effectively and sufficiently reduced.

The epitaxial wafer according to the present invention includes the epitaxial film on the main surface of the wafer, in which a height of an edge crown, which is formed on a wafer peripheral portion of the epitaxial film, from a level surface of the epitaxial film is within 30% with respect to a thickness of the epitaxial film at a wafer center. Therefore, the width of the edge exclusion zone can be further reduced, and an epitaxial wafer in which an effective area ratio which can be achieved in a semiconductor chip is high can be achieved.

In the manufacturing device and the manufacturing method according to the present invention, the above-described wafer support portion is used. Therefore, by using the manufacturing device and the manufacturing method according to the present invention, an edge crown can be effectively and sufficiently reduced, and a SiC epitaxial wafer having a small width of the edge exclusion zone and a large effective area in which the in-plane carrier concentration is uniform can be obtained.

BRIEF DESCRIPTION OF DRAWINGS

FIG. 8 is a schematic cross-sectional view showing a wafer support according to a fourth embodiment of the present invention.

FIG. 9 is a schematic cross-sectional view showing a wafer support according to a fifth embodiment of the present invention.

DESCRIPTION OF EMBODIMENTS

Figure 1:
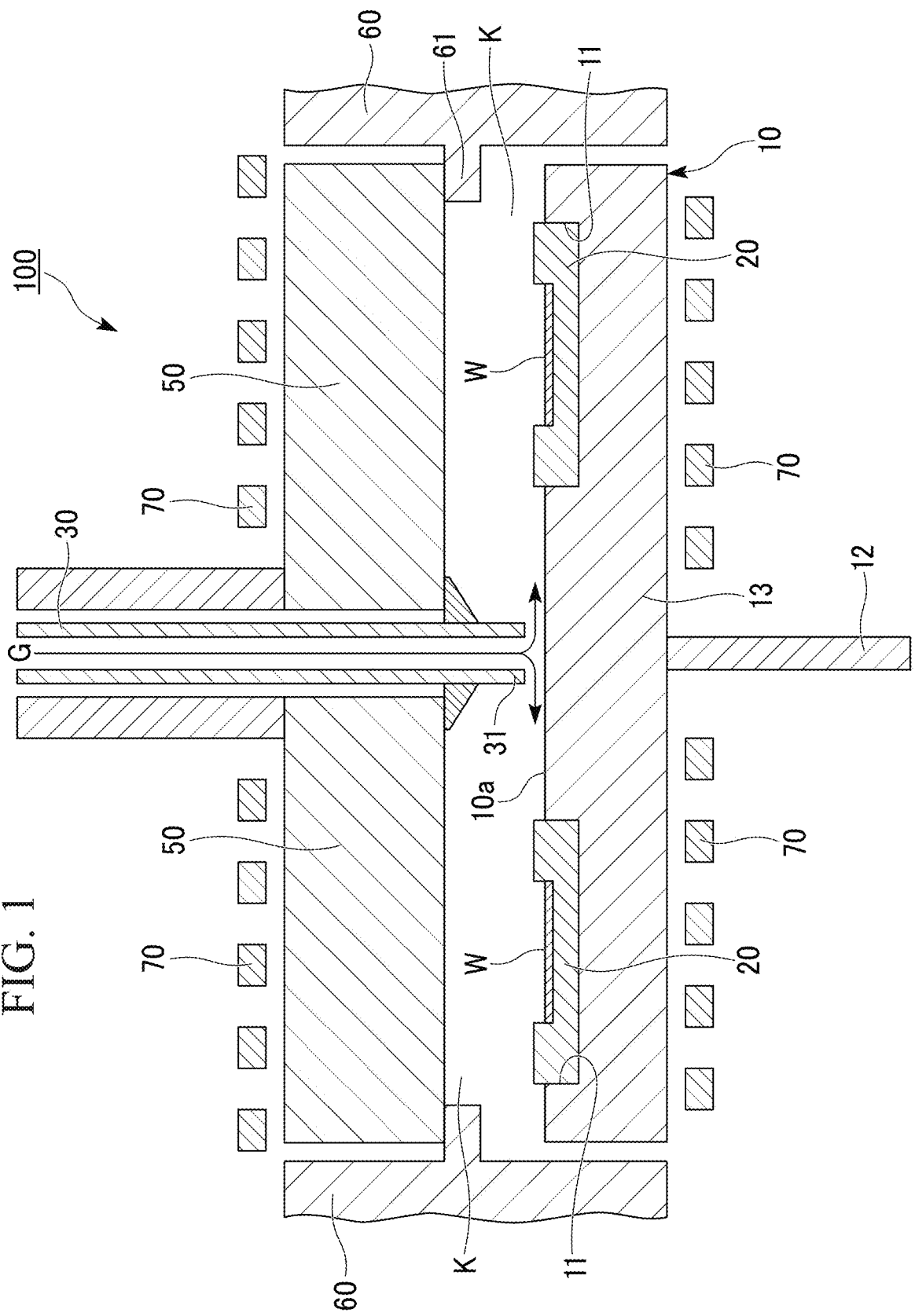
FIG. 1 is a schematic cross-sectional view schematically showing a chemical vapor phase growth device according to an embodiment of the present invention.

Hereinafter, a wafer support portion, a chemical vapor phase growth device, an epitaxial wafer, and a method of manufacturing an epitaxial wafer to which the present invention is applied will be described in detail appropriately with reference to the drawings.

In the drawings used in the following description, for the sake of convenience, some characteristic portions are shown in an enlarged manner in order to make the characteristics of the present invention easily understood, and dimensional proportions and the like of the respective components are different from the actual ones. In addition, materials, dimensions, and the like in the following description are merely exemplary, but the present invention is not limited thereto. Within a range not departing from the scope of the present invention, various modifications can be made.

"Wafer" described in the present invention may refer to a single-crystal substrate wafer before epitaxial growth, or a wafer including an epitaxial film. In addition, "wafer" may also refer to a wafer during epitaxial growth. In particular, a wafer after epitaxial growth will be referred to as "epitaxial wafer" in order to distinguish it from the others.

(Chemical Vapor Phase Growth Device, Wafer Support)

FIG. 1 is a diagram schematically showing a cross-section of a chemical vapor phase growth device according to an embodiment of the present invention.

The chemical vapor phase growth device according to the present invention is not limited to the configuration shown in FIG. 1. Hereinafter, for easy understanding, the present invention will be described based on the chemical vapor phase growth device shown in FIG. 1.

In a chemical vapor phase growth device 100 according to an embodiment of the present invention, a layer is deposited and grown on a surface of a heated wafer W while supplying a raw material gas G into a chamber (film forming chamber) capable of evacuation under reduced pressure. For example, in a case where SiC is epitaxially grown, for example, silane ($SiH_4$), dichlorosilane ($SiCl_2H_2$), trichlorosilane ($SiCl_3$), or silicon tetrachloride ($SiCl_4$) can be used as a Si source of the raw material gas G As a carbon (C) source, for example, propane ($C_3H_8$), ethane ($C_2H_6$), or ethylene ($C_2H_4$) can be used. In addition, as a carrier gas, for example, a gas including hydrogen ($H_2$) can be used.

The chemical vapor phase growth device 100 includes, in the chamber: a mounting plate 10 on which a plurality of wafers W are mounted; a ceiling (top plate) 50 that is disposed opposite to an upper surface of the mounting plate 10 such that a reaction space K is formed between the ceiling 50 and the mounting plate 10; and a peripheral wall 60 that is positioned outside the mounting plate 10 and the ceiling 50 so as to surround the reaction space K. In this example, a plurality of wafer supports 20 are provided on the upper surface side of the mounting plate 10 as described below.

In addition, an induction coil (heating means) 70 is provided so as to surround the mounting plate 10 and the ceiling 50.

In a case where a high-frequency current is supplied from a high-frequency power supply (not shown) to the induction coil 70, the mounting plate 10 and the ceiling 50 are heated by high frequency induction heating. The wafer W mounted on the wafer support 20 can be heated, for example, by radiation from the mounting plate 10 and the ceiling 50 or by thermal conduction from the wafer support 20. The heating means is not limited to the configuration where it is disposed on a lower surface side of the mounting plate 10 (rotating base 13) and an upper surface side of the ceiling 50. The heating means may also be disposed on only one side of the lower surface side of the mounting plate 10 (rotating base 13) and the upper surface side of the ceiling 50. In addition, the heating means is not limited to high frequency induction heating and, for example, resistance heating may be used.

A gas introduction pipe 30 is provided so as to vertically pass through the center of the ceiling 50. The raw material gas G released from the gas introduction pipe 30 radially flows to the wafer W in a direction from the inside to the outside of the reaction space K. The raw material gas G can be supplied parallel to a plane of the wafer W. Gas which becomes unnecessary in the chamber can be exhausted to the outside of the chamber through an exhaust port provided outside of the peripheral wall 60.

The mounting plate 10 adopts a so-called planetary (rotating/revolving) type, and a rotating shaft 12 is connected to the center of the bottom of the mounting plate 10. Regarding the mounting plate 10, when the rotating shaft 12 is rotated by a drive motor (not shown), the rotating base 13 is rotated around the central axis of the rotating shaft 12.

Figure 2:
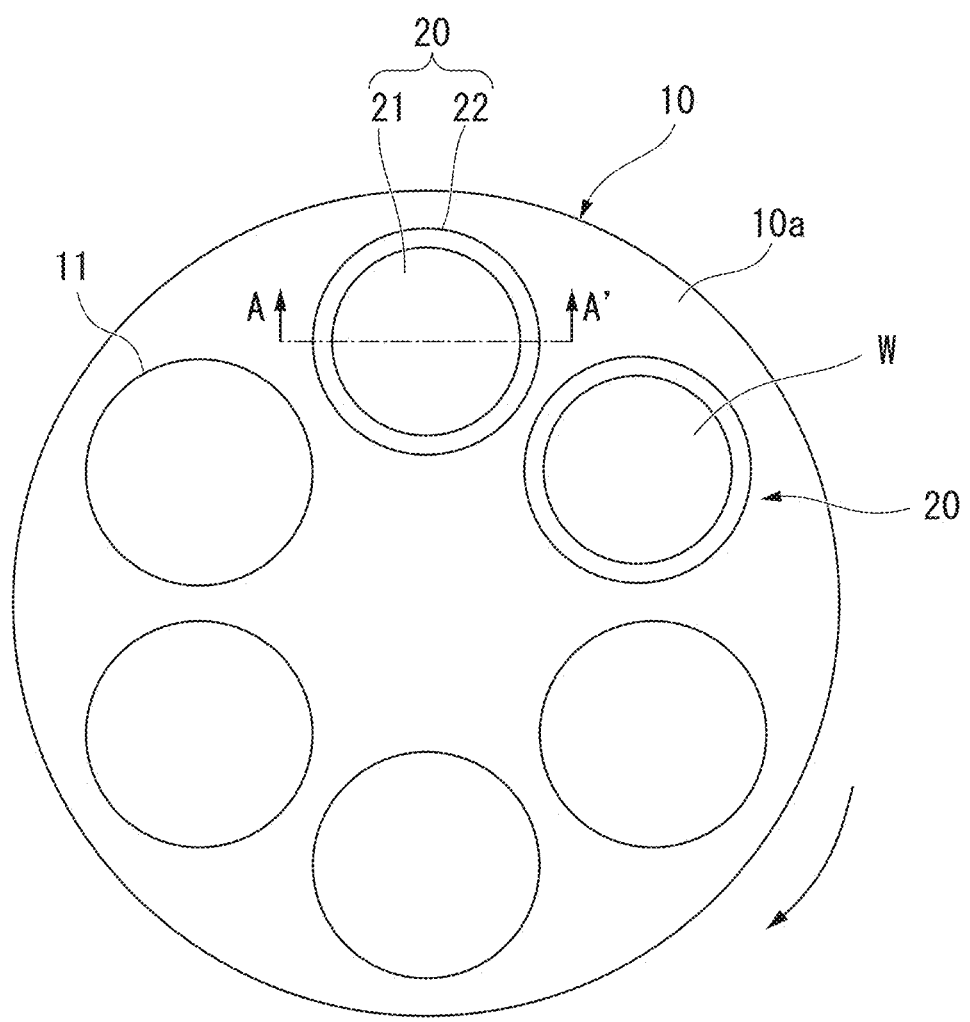
FIG. 2 is a schematic plan view showing a mounting plate of a chemical vapor phase growth device including a wafer support according to any one of first to third embodiments of the present invention.

The mounting plate 10 has a circular shape in a plan view, and a plurality of concave holders 11 are provided at regular intervals in a circumferential direction (rotating direction) of the rotating base 12. FIG. 2 is a schematic plan view showing the mounting plate 10 of the chemical vapor phase growth device 100. In an example shown in FIG. 2, six concave holders 11 are provided at regular intervals.

The wafer support 20 according to any one of first to third embodiments of the present invention is held on the concave holder 11 of the mounting plate 10 as shown in FIG. 2, and the wafer W is mounted on an upper surface of the wafer support 20. In FIG. 2, for simplicity, the wafer support 20 is held on only two concave holders 11 of the mounting plate 10, but the present invention is not limited to this configuration.

The wafer support 20 is configured to be rotated around the central axis by supplying another gas for driving, which is different from the raw material gas between a lower surface of the wafer support 20 and the concave holder 11 (not shown). As a result, a film can be uniformly formed on the wafer W mounted on the wafer support 20.

Figure 3:
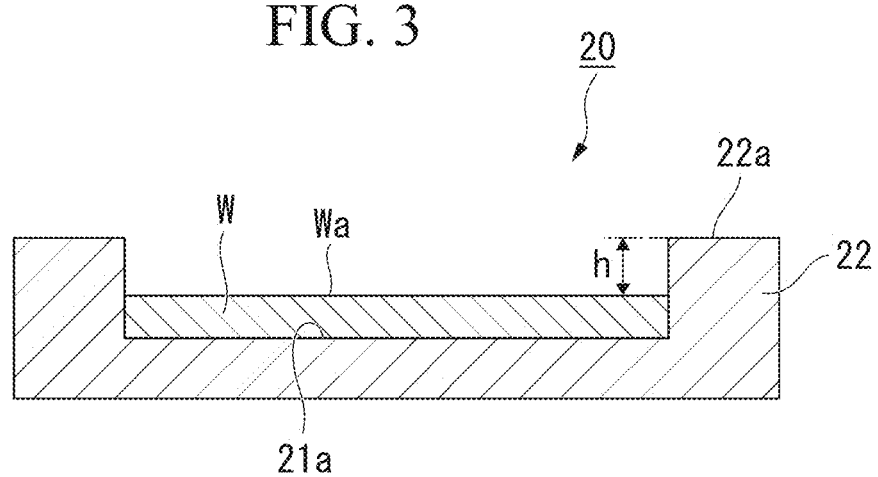
FIG. 3 is a schematic cross-sectional view showing a wafer support according to a first embodiment of the present invention.

FIG. 3 is a schematic cross-sectional view showing an A-A' surface (FIG. 2) of a wafer support according to a first embodiment of the present invention. The wafer support 20 includes: a wafer mounting surface 21a having an upper surface on which a substrate is mounted; and a wafer support portion 22 that rises to surround a wafer to be mounted. A height h from a portion of a reaction space K side-upper surface 22a of the wafer support portion 22, which is most distant from the wafer mounting surface 21a, to a main surface Wa of the wafer W mounted on the wafer mounting surface 21a is 1 mm or more. In addition, the height h is preferably 1.5 mm or more and more preferably 2 mm or more. In addition, the height h is preferably 5 mm or less.

In a case where the height h from the portion of the reaction space K side-upper surface 22a of the wafer support portion 22, which is most distant from the wafer mounting surface 21a, to the main surface Wa of the wafer W mounted on the wafer mounting surface 21a is 1 mm or more, the supply of the raw material gas to an outer peripheral portion of the wafer is suppressed, and the growth of an edge crown can be suppressed. As the height h is 1 mm or more and further increases, a ratio of the height of the edge crown to the thickness of an epitaxial film can be reduced.

In addition, it is not preferable that the height h is more than 5 mm because a laminar flow of gas supplied into the chemical vapor phase growth device is interrupted.

Here, "the portion of the reaction space side-upper surface which is most distant from the wafer mounting surface" refers to a portion of the wafer support portion which is most distant from the wafer mounting surface in the vertical direction. In addition, in the above description "from the portion of the reaction space K side-upper surface 22a of the wafer support portion 22, which is most distant from the wafer mounting surface 21a, to the main surface Wa of the wafer W mounted on the wafer mounting surface 21a", the main surface of the wafer refers to a main surface of a single-crystal substrate in principle.

The thickness of the single-crystal substrate can be clearly defined because the thickness is fixed and the main surface of the single-crystal substrate is flat.

On the other hand, during epitaxial growth, basically, an epitaxial film is grown while maintaining surface uniformity at a predetermined value or lower. Further, the thickness of an epitaxial film to be grown is smaller than the thickness of the single-crystal substrate. Therefore, the epitaxial film can be considered as the main surface of the epitaxial wafer during and after the growth. That is, the distance between the main surface of the epitaxial wafer surface on which the desired epitaxial film is formed and the portion of the reaction space side-upper surface of the wafer support portion which is most distant from the wafer mounting surface may be 1 mm or more.

In FIG. 3, the upper surface 22a is a plane which is parallel to the wafer mounting surface. Therefore, any point on the upper surface 22a is the portion which is most distant from the wafer mounting surface.

In addition, "height" described herein refers to the length of a vertical line from the portion of the reaction space side-upper surface which is most distant from the wafer mounting surface to an extended line of the wafer mounting surface.

In addition, an edge crown refers to a portion having the largest thickness in an edge portion of an epitaxial film which is grown on an epitaxial substrate.

In the related art, during epitaxial growth of silicon or the like in the related art, in a case where the above-described height is several hundreds of micrometers or more, it has been expected that a laminar flow of gas would be interrupted, and a configuration in which the height is in the above-described range has not been considered. However, contrary to the expectation, it was found that, even in a case where the difference in level is about several millimeters, there is no difference in the performance of the epitaxial film formed on the wafer W. At this time, it was found that the growth of an edge crown can be efficiently suppressed at the same time.

In a case where the epitaxial growth is performed at a growth pressure of 25 kPa or lower and a high growth temperature of 1400° C. or higher, the effect of the difference in level is particularly small, and there is substantially no difference in the performance of the epitaxial film formed on the wafer W. That is, this represents that the difference in level has little effect on a SiC epitaxial film which is formed under the above-described conditions.

Figure 4:
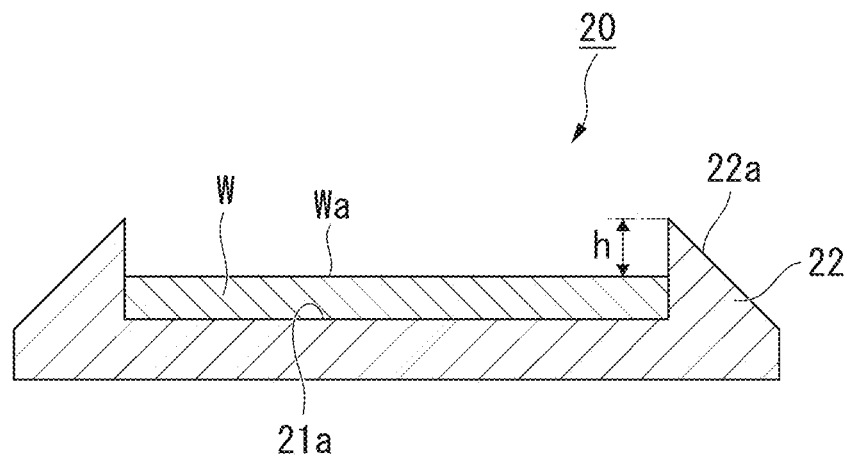
FIG. 4 is a schematic cross-sectional view showing a wafer support according to a second embodiment of the present invention.

FIG. 4 is a schematic cross-sectional view showing an A-A' surface (FIG. 2) of a wafer support according to a second embodiment of the present invention. The shape of a cross-section of the A-A' surface (refer to FIG. 2) of the wafer support portion 22 is not necessarily quadrangular as shown in FIG. 3 and may be triangular as shown in FIG. 4.

In a case where the shape of the cross-section is triangular as shown in FIG. 4, "the portion of the reaction space side-upper surface which is most distant from the wafer mounting surface" refers to an apex which is most distant from the triangular wafer mounting surface 21a in the vertical direction.

In a case where the cross-section has a shape which falls from upper ends of wafer support side surfaces of the wafer support portion 22 on the wafer W side to the outer periphery thereof as shown in FIG. 4, even when particles are attached to the upper surface 22a of the wafer support portion 22, the particles fall to the outer periphery. Therefore, the reattachment of the particles to the wafer W can be suppressed.

Figure 5:
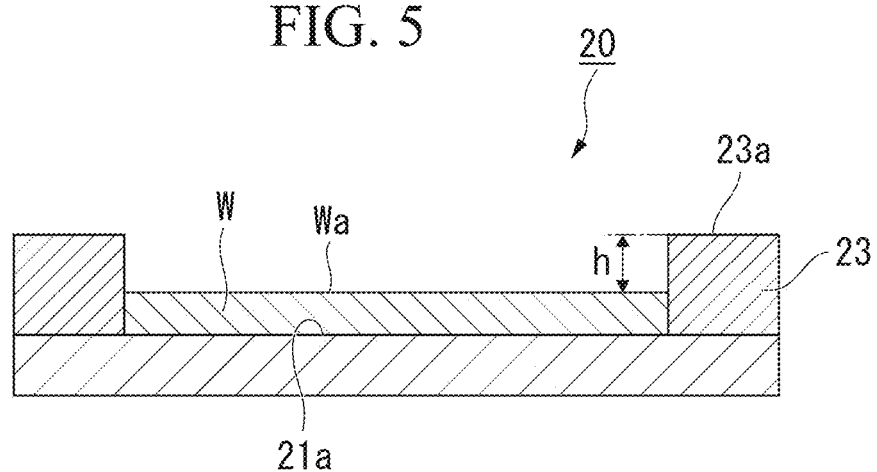
FIG. 5 is a schematic cross-sectional view showing a wafer support according to a third embodiment of the present invention.

FIG. 5 is a schematic cross-sectional view showing an A-A' surface (FIG. 2) of a wafer support according to a third embodiment of the present invention. The wafer support portion is not necessarily integrated with the wafer support 20 and may be formed using another member as shown in FIG. 5. Specifically, a ring-shaped member 23 may be mounted on the wafer support 20 such that the wafer W can be rotated to be horizontally movable. That is, the ring-shaped member 23 forms the wafer support portion.

It is preferable that the wafer support portion 22 includes the same material as that of the epitaxial film formed on the main surface of the wafer W. It is more preferable that the growth space K side of the wafer support portion 22 is formed of the same material as that of the epitaxial film. In a case where the wafer support portion 22 includes the same material as that of the epitaxial film formed on the main surface of the wafer W, even when part of the wafer support portion 22 is sublimated, the effect on the epitaxial film formed on the main surface of the wafer W can be suppressed. In addition, during the epitaxial growth, a reaction occurs even in a portion other than the wafer W, and attached materials are deposited thereon. By adopting the configuration in which the wafer support portion 22 includes the same material as that of the epitaxial film, a difference in thermal expansion coefficient at an interface between the attached materials and a non-attached surface is suppressed, and the attached material can be prevented from peeling to form particles. In addition, in order to set an interval between the wafer support portion and the outer peripheral portion of the wafer W to be small, it is preferable that the thermal expansion coefficient of the wafer support portion is similar to that of the wafer W, and it is desirable that the wafer support portion 22 includes the same material as that of the epitaxial film.

Figure 6:
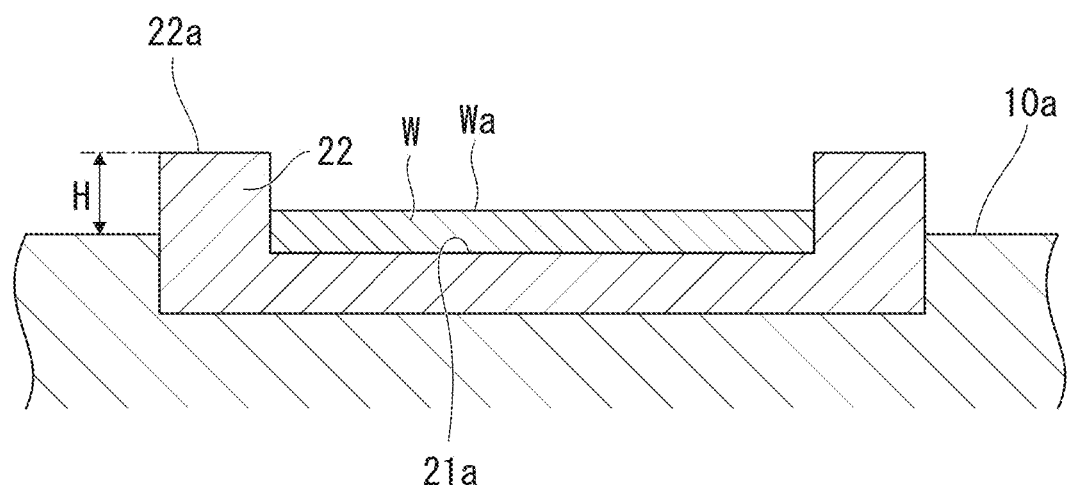
FIG. 6 is a schematic cross-sectional view showing an A-A' surface (FIG. 2) including up to the mounting plate surrounding the wafer support according to the first embodiment of the present invention.

FIG. 6 is a schematic cross-sectional view showing the A-A' surface (FIG. 2) including up to the mounting plate surrounding the wafer support according to the first embodiment of the present invention.

As shown in FIG. 6, a height H from the highest point of the reaction space K side-upper surface 22a of the wafer support portion 22 to a reaction space K-side upper surface 10a of the mounting plate 10 is preferably −1 mm to 5 mm and more preferably 0 mm to 2 mm.

In a case where the height is more than 5 mm, a laminar flow of gas which is supplied from a surface parallel to the mounting plate 10 is interrupted due to the difference in level, and it is difficult to grow a uniform epitaxial film. In a case where the height H is −1 mm, that is, the wafer support portion is lower than the reaction space K-side upper surface 10a by 1 mm or less, there is no significant effect on the laminar flow of gas. It is not preferable that the height H is less than −1 mm because the flow of gas is interrupted due to the difference in level formed and a turbulence is likely to be generated.

Regarding the growth pressure and the growth temperature, in the case of 4H or 6H silicon carbide single-crystal epitaxial growth, the growth pressure is preferably 5 kPa to 25 kPa, and the growth temperature is preferably 1400° C. to 1700° C. A highly crystalline epitaxial growth film can be obtained.

The flow rate of gas supplied to the main surface Wa of the wafer W mounted on the wafer support 20 is preferably 0.1 m/s to 10 m/s and more preferably 0.2 m/s to 5 m/s.

In a case where the flow rate of gas supplied to the main surface Wa of the wafer W is higher than 10 m/s, a turbulence is likely to be generated due to even a small difference in level. That is, in a case where the difference in level between the upper surface 22a of the wafer support portion 22 and the main surface Wa of the wafer W is large, a turbulence is likely to be generated.

In addition, in a case where the flow rate of gas supplied to the main surface Wa of the wafer W is lower than 0.1 m/s, although it is fundamentally desirable that the gas reacts on the wafer W for epitaxial growth, a reaction occurs before the gas reaches the wafer W, and deposits are attached to a portion other than the wafer. These attached materials are peeled off to form particles.

The flow rate of gas can be obtained by dividing the volume per unit time of gas, which flows during epitaxial growth under predetermined epitaxial conditions (temperature, pressure), by the area of a cross-section where the gas flows. In the embodiment of the present invention, the height of the space where the gas flows is fixed to a low value. Therefore, by multiplying the length of a circumference at a given distance from the center by the height of the space where the gas flows, the area of the cross-section where the gas flows can be obtained. In the embodiment of the present invention, the gas radially flows from the center. Therefore, as the distance from the center increases, the flow rate of gas is delayed. In this case, it is desirable that the flow rate of gas is in a radial range corresponding to a position of the wafer W. In addition, in a case where the flow of gas is more complicated, the flow rate of gas flowing above the wafer may be obtained by simulation.

It is preferable that the interval between the wafer support portion 22 and the outer peripheral portion of the wafer W is as small as possible. In a case where there is a space between the wafer support portion 22 and the outer peripheral portion of the wafer W, the flow of gas is interrupted in this space, and an edge crown is likely to be grown. In addition, it is necessary that the wafer W is set in the wafer support portion 22 and then is extracted therefrom after the completion of growth. Therefore, it is necessary that a minimum clearance is provided. The interval between the wafer support portion 22 and the outer peripheral portion of the wafer W is preferably 0.1 mm to 0.5 mm.

In addition, an orientation flat (hereinafter, referred to as "OF") may be provided on the wafer W. In this case, in a case where the internal shape of the wafer support portion 22 is circular, an interval between the OF and the wafer support portion increases. In this case, the size of an edge crown in the OF portion at a wafer end increases. During the preparation of a device, a portion having a given width is removed from the vicinity of the OF, and thus the edge crown has substantially little effect on the product quality. However, in a case where the size of the edge crown is a given value or more, there may be an adverse effect on a photolithography process or the like. Therefore, the interval of the wafer support portion 22 and the outer peripheral portion of the OF portion of the wafer W is preferably 0.1 mm to 0.5 mm.

Therefore, it is more preferable that wafer support portion 22 is disposed along the periphery of the wafer W. For example, in a case where an OF is provided on the wafer W, it is preferable that the wafer support portion 22 is formed along a shape of the OF. When a portion of the wafer W where an OF is formed (hereinafter, referred to as "OF portion") is seen in a plan view, the outer peripheral portion of the wafer W where an edge crown is grown is present inside of other members. In a case where the wafer support portion 22 is formed in a circular shape without being formed along a shape of an OF, there is a distance between the OF portion and the wafer support portion 22, and it is difficult to sufficiently obtain a shielding effect of the wafer support portion 22. That is, it is difficult to sufficiently suppress the size of an edge crown formed on the OF portion. By disposing the wafer support portion 22 along the periphery of the wafer W, the interval of the wafer support portion 22 and the outer peripheral portion of the wafer W, which includes the OF portion, can be made to be a given value or less. As a result, an epitaxial wafer in which the height of the edge crown is suppressed over the entire edge portion of the wafer can be obtained.

In addition, in a case where a portion which is not covered with the wafer W is present on the wafer mounting surface 21a, crystals are deposited on this portion. Due to these deposits, the wafer W may float from the mounting surface. Therefore, by disposing the wafer support portion 22 along the periphery of the wafer W, unnecessary deposition of crystals on a portion of the mounting surface outside of an OF can be prevented.

Figure 7:
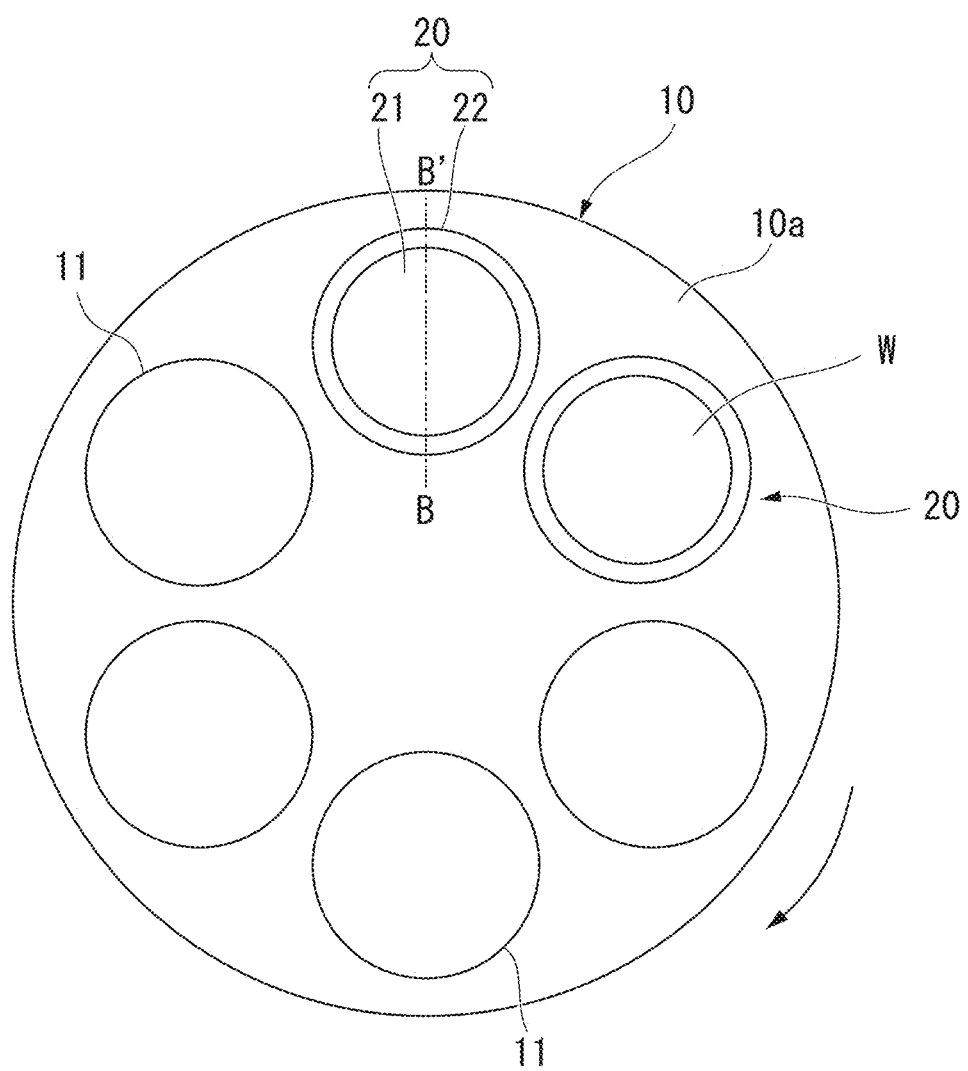
FIG. 7 is a schematic plan view showing a mounting plate of a chemical vapor phase growth device (a device for manufacturing a SiC epitaxial wafer) including a wafer support according to any one of fourth to ninth embodiments of the present invention.

The wafer support 20 according to any one of fourth to ninth embodiments of the present invention is held on the concave holder 11 of the mounting plate 10 as shown in FIG. 7, and the wafer W is mounted on an upper surface of the wafer support 20. In FIG. 7, for simplicity, the wafer support 20 is held on only two concave holders 11 of the mounting plate 10, but the present invention is not limited to this configuration.

The wafer support 20 is configured to be rotated around the central axis of the wafer support 20 by supplying another gas for driving, which is different from the raw material gas between a lower surface of the wafer support 20 and the concave holder 11 (not shown). As a result, each wafer support 20 is rotated separately from the rotation of the mounting plate 10. Therefore, a film can be uniformly formed on the wafer W mounted on the wafer support 20.

FIG. 8 is a schematic cross-sectional view showing a B-B' surface (FIG. 7) of a wafer support according to a fourth embodiment of the present invention. The wafer support 20 according to this embodiment includes: a disk-shaped wafer mounting portion 21 having an upper surface 21a on which a substrate is mounted; and a ring-shaped wafer support portion 22 that rises to surround a wafer W to be mounted. In the wafer mounting portion 21, a peripheral step portion 21b is formed on an upper edge surface side, and the ring-shaped wafer support portion 22 is inserted into this peripheral step portion 21b. The wafer mounting portion 21 and the wafer support portion 22 which are integrated are held on the concave holder 11.

The wafer mounting portion 21 can adopt, for example, a structure in which a disk-shaped outer peripheral surface formed of graphite is covered with a coating film of TaC or SiC. The wafer support portion 22 is formed of, for example, graphite.

A height h from a portion of a reaction space K side-upper surface 22a of the wafer support portion 22, which is most distant from the wafer mounting surface 21a, to a main surface Wa of the wafer W mounted on the wafer mounting surface 21a is 1 mm or more. In addition, the height h is preferably 1.5 mm or more and more preferably 2 mm or more. In addition, the height h is preferably 5 mm or less.

In a case where the height h from the portion of the reaction space K side-upper surface 22a of the wafer support portion 22, which is most distant from the wafer mounting surface 21a, to the main surface Wa of the wafer W mounted on the wafer mounting surface 21a is 1 mm or more, the supply of the raw material gas to an outer peripheral portion of the wafer is suppressed, and the growth of an edge crown can be suppressed.

As the height h is 1 mm or more and further increases, a ratio of the height of the edge crown to the thickness of an epitaxial film can be reduced. In addition, it is not preferable that the height h is more than 5 mm because a laminar flow of gas supplied into the chemical vapor phase growth device is interrupted.

Here, "the portion of the reaction space side-upper surface which is most distant from the wafer mounting surface" refers to a portion of the wafer support portion which is most distant from the wafer mounting surface in the vertical direction. In addition, in the above description "from the portion of the reaction space K side-upper surface 22a of the wafer support portion 22, which is most distant from the wafer mounting surface 21a, to the main surface Wa of the wafer W mounted on the wafer mounting surface 21a", the main surface of the wafer refers to a main surface of a single-crystal substrate in principle.

The thickness of the single-crystal substrate can be clearly defined because the thickness is fixed and the main surface of the single-crystal substrate is flat.

On the other hand, during epitaxial growth, basically, an epitaxial film is grown while maintaining surface uniformity at a predetermined value or lower. Further, the thickness of an epitaxial film to be grown is smaller than the thickness of the single-crystal substrate. Therefore, the epitaxial film can be considered as the main surface of the epitaxial wafer during and after the growth. That is, the distance between the main surface of the epitaxial wafer surface on which the desired epitaxial film is formed and the portion of the reaction space side-upper surface of the wafer support portion which is most distant from the wafer mounting surface may be 1 mm or more.

In FIG. 8, the upper surface 22a is a plane which is parallel to the wafer mounting surface. Therefore, any point on the upper surface 22a is the portion which is most distant from the wafer mounting surface.

In addition, "height" described herein refers to the length of a vertical line from the portion of the reaction space side-upper surface which is most distant from the wafer mounting surface to an extended line of the wafer mounting surface.

In addition, an edge crown refers to a portion having the largest thickness in an edge portion of an epitaxial film which is grown on an epitaxial substrate.

In FIG. 8, a cross-section of the wafer support portion 22 is rectangular but may be triangular.

In the related art, during epitaxial growth of silicon or the like in the related art, in a case where the above-described height is several hundreds of micrometers or more, it has been expected that a laminar flow of gas would be interrupted, and a configuration in which the height is in the above-described range has not been considered. However, contrary to the expectation, it was found that, even in a case where the difference in level is about several millimeters, there is no difference in the performance of the epitaxial film formed on the wafer W. At this time, it was found that the growth of an edge crown can be efficiently suppressed at the same time.

In a case where the epitaxial growth is performed at a growth pressure of 25 kPa or lower and a high growth temperature of 1400° C. or higher, the effect of the difference in level is particularly small, and there is substantially no difference in the performance of the epitaxial film formed on the wafer W. That is, this represents that the difference in level has little effect on a SiC epitaxial film which is formed under the above-described conditions.

FIG. 8 is a schematic cross-sectional view showing the B-B' surface (FIG. 7) including up to the mounting plate surrounding the wafer support according to the fourth embodiment of the present invention.

As shown in FIG. 8, a height H from the highest point of the reaction space K side-upper surface 22a of the wafer support portion 22 to a reaction space K-side upper surface 10A of the mounting plate 10 is preferably −1 mm to 5 mm and more preferably 0 mm to 2 mm.

In a case where the height is more than 5 mm, a laminar flow of gas which is supplied from a surface parallel to the mounting plate 10 is interrupted due to the difference in level, and it is difficult to grow a uniform epitaxial film.

In the wafer support portion 22 according to the embodiment, the entire area is formed of graphite, and graphite is exposed on the entire surface of the wafer support portion 22. As indicated by the diagonal lines in FIG. 8, a coating layer 22b may be formed on each of an upper surface, an upper edge portion, a lower surface, and a lower edge portion of the wafer support portion 22 such that graphite on the upper surface side of the wafer support portion 22 and graphite on the lower surface side of the wafer support portion 22 are partially covered. As the coating layer, a thin film formed of a metal carbide such as TaC can be used.

By covering graphite on the upper surface side and the lower surface side of the wafer support portion 22, the area where graphite is exposed can be reduced. Therefore, the amount of carbon supplied from the wafer support portion 22 during film forming can be adjusted to a desired value depending on the area of the wafer support portion 22 covered with the coating layer 22b.

It is preferable that the wafer support portion 22 includes the same material as that of the epitaxial film formed on the main surface of the wafer W. In a case where the wafer support portion 22 includes the same material as that of the epitaxial film formed on the main surface of the wafer W, even when part of the wafer support portion 22 is sublimated, the effect on the epitaxial film formed on the main surface of the wafer W can be suppressed. In addition, during the epitaxial growth, a reaction occurs even in a portion other than the wafer W, and attached materials are deposited thereon. By adopting the configuration in which the wafer support portion 22 includes the same material as that of the epitaxial film, a difference in thermal expansion coefficient at an interface between the attached materials and a non-attached surface is suppressed, and the attached material can be prevented from peeling to form particles. In the wafer support portion which includes the same material as that of the epitaxial film, the upper surface side of the wafer support portion can be formed of SiC polycrystal.

The flow rate of gas supplied to the main surface Wa of the wafer W mounted on the wafer support 20 is preferably 0.1 m/s to 10 m/s and more preferably 0.2 m/s to 5 m/s.

In a case where the flow rate of gas supplied to the main surface Wa of the wafer W is higher than 10 m/s, a turbulence is likely to be generated due to even a small difference in level. That is, in a case where the difference in level between the upper surface 22a of the wafer support portion 22 and the main surface Wa of the wafer W is excessively large, a turbulence is likely to be generated.

In addition, in a case where the flow rate of gas supplied to the main surface Wa of the wafer W is lower than 0.1 m/s, although it is fundamentally desirable that the gas reacts on the wafer W for epitaxial growth, a reaction occurs before the gas reaches the wafer W, and deposits are attached to a portion other than the wafer. These attached materials are peeled off to form particles.

In addition, it is preferable that wafer support portion 22 is disposed along the periphery of the wafer W. For example, in a case where an orientation flat (OF) is provided on the wafer W, it is preferable that the wafer support portion 22 is formed along a shape of the orientation flat. A portion of the wafer W where an orientation flat is formed (hereinafter, referred to as "OF portion") is present inside of the outer peripheral portion of the wafer W where an edge crown is grown when seen in a plan view. In a case where the wafer support portion 22 is formed in a circular shape without being formed along a shape of an orientation flat, there is a distance between the OF portion and the wafer support portion 22, and it is difficult to sufficiently obtain a shielding effect of the wafer support portion 22. That is, it is difficult to sufficiently suppress the size of an edge crown formed on the OF portion.

In addition, in a case where a portion which is not covered with the wafer W is present on the wafer mounting surface 21a, crystals are deposited on this portion. Due to these deposits, the wafer W may float from the mounting surface. Therefore, by disposing the inner periphery of the wafer support portion 22 along the periphery of the wafer W, unnecessary deposition of crystals on a portion of the mounting surface outside of an orientation flat can be prevented.

In addition, a support portion 61 is a shielding plate support portion which is provided over the entire inner peripheral surface of the peripheral wall 60, and the outer peripheral portion of the ceiling 50 is mounted on the shielding plate support portion.

In the manufacturing device 100 according to the embodiment, the raw material gas G is supplied downward from the raw material gas introduction pipe 30 such that the raw material gas G flowing from the outer peripheral end portion of the wafer W, which is mounted on the wafer support 20, passes through a region above the main surface Wa of the wafer W. In addition, an epitaxial film can be formed on the wafer W by depositing an epitaxial material on the wafer W while maintaining the wafer W at a high temperature using the induction coil (heating means) 70 such as a high-frequency coil.

At this time, during heating by the heating means, carbon (C) is produced from the wafer support portion 22 formed of graphite, and the carbon is supplied to the upstream side of the flow of the raw material gas that is, to an F1 side of an arrow F in FIG. 8. As a result, the C/Si ratio in the upstream (F1) side increases.

As described above, the decomposition rate of hydrocarbon gas constituting the raw material gas G is slower than that of Si included in silane gas. Therefore, the C concentration tends to be low particularly in the outer peripheral portion of the SiC epitaxial film which is positioned on the upstream side of the flow of the raw material gas G.

On the other hand, in the manufacturing device 100 according to the embodiment, the above-described configuration including the wafer support portion 22 formed of graphite is adopted. As a result, carbon is supplied to the upstream (F1) side of the flow of the raw material gas the C/Si ratio in the gas in the vicinity of the outer peripheral portion of the SiC epitaxial film increases, and the SiC epitaxial film can be grown. Thus, a variation in the C/Si ratio in a plane of the SiC epitaxial film, which is caused by a difference in decomposition rate between respective components constituting the raw material gas can be suppressed. This way, the positional dependence of the C/Si ratio in the gas in the entire plane of the SiC epitaxial film is reduced, and a variation in the carrier concentration of the SiC epitaxial film can also be reduced.

In a planetary device as in the embodiment, the gas is diffused from the center to the outer peripheral side of the revolving mounting plate, and the raw material gas is decomposed and consumed. Therefore, the growth rate of the SiC epitaxial film decreases toward the outer peripheral portion of the mounting plate. Thus, focusing on one end portion of the SiC substrate, gas present in the center contributes more to the epitaxial growth. In a case where the wafer support 20 is rotating, the contribution is averaged to some extent. However, regarding substantial growth conditions, when the center and the outer peripheral portion of the wafer are compared to each other, the wafer peripheral portion is positioned on the upstream of the gas, and this configuration is reflected on the carrier concentration distribution.

The wafer support 20 is not limited to the configuration shown in FIG. 8 and can adopt various configurations.

FIG. 9 shows a wafer support according to a fifth embodiment of the present invention. A wafer support 25 according to this embodiment includes: the same wafer mounting portion 21 as described in the above-described embodiments; and a double ring-shaped wafer support portion 26 that is fitted to an outer peripheral portion of the wafer mounting portion 21. The wafer support portion 26 includes: a ring-shaped inner peripheral support member 26A that is provided in an inner periphery of the wafer support portion 26; and a ring-shaped outer peripheral support member 26B that is provided in an outer periphery of the inner peripheral support member 26A.

In this example, the inner peripheral support member 26A and the outer peripheral support member 26B have the same height, and the above-described height h is defined by upper surfaces 26a thereof.

Both the support members 26A and 26B in this embodiment are formed of graphite.

In this embodiment, for example, graphite on the entire surface of the inner peripheral support member 26A is exposed, and the entire surface of the outer peripheral support member 26B is covered with a coating layer formed of SiC, TaC, or the like. As a result, the amount of carbon supplied from the wafer support portion 26 during film forming can be changed from that in the above-described embodiments. In addition, the entire surface of the inner peripheral support member 26A may be covered with a coating layer formed of SiC, TaC, or the like, and graphite on the entire surface of the outer peripheral support member 26B may be exposed. Due to this configuration, the amount of carbon supplied from the wafer support portion 26 during film forming can be changed from that in the above-described structures.

Figure 10:
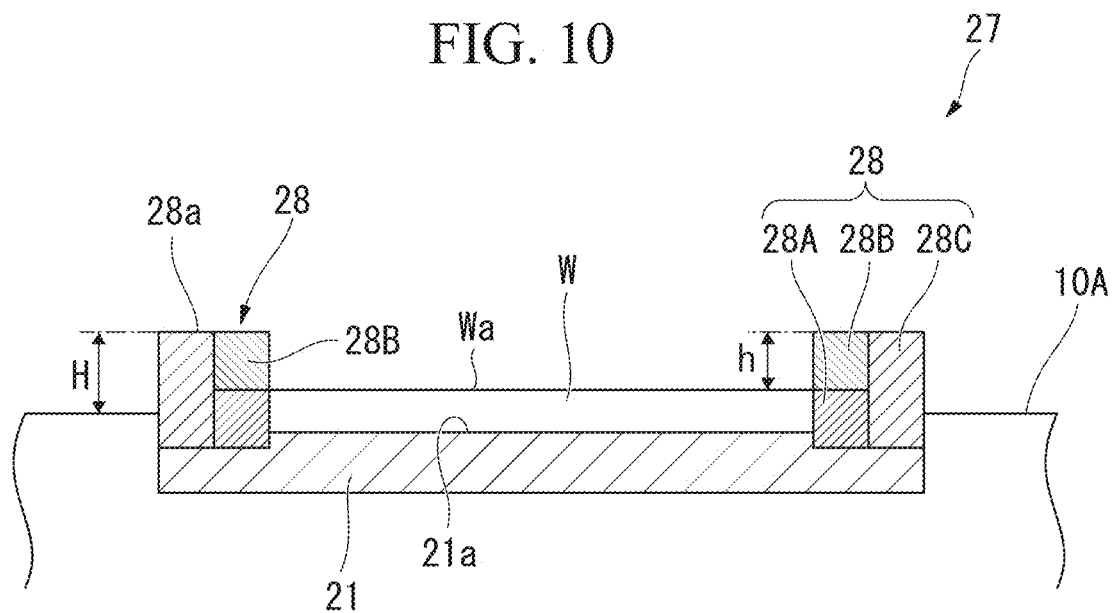
FIG. 10 is a schematic cross-sectional view showing a wafer support according to a sixth embodiment of the present invention.

FIG. 10 shows a wafer support according to a sixth embodiment of the present invention. A wafer support 27 according to this embodiment includes: the wafer mounting portion 21; and a multiple ring-shaped wafer support portion 28 that is fitted to an outer peripheral portion of the wafer mounting portion 21. The wafer support 28 includes: a ring-shaped inner peripheral lower support member 28A and a ring-shaped inner peripheral upper support member 28B that are formed of graphite and are provided in upper and lower sides of an inner periphery of the wafer support 28; and a ring-shaped outer peripheral support member 28C that is provided in an outer periphery of the inner peripheral lower support member 28A and the inner peripheral upper support member 28B.

In this structure, for example, the inner peripheral lower support member 28A is covered with a coating layer formed of TaC or SiC and graphite on the entire surface of the inner peripheral upper support member 28B is exposed such that carbon can be supplied from only the inner peripheral upper support member 28B.

In addition, for example, the inner peripheral upper support member 28B is covered with a coating layer formed of TaC or SiC and graphite on the entire surface of the inner peripheral lower support member 28A is exposed such that carbon can be supplied from only the inner peripheral lower support member 28A.

In this embodiment, among the inner peripheral lower support member 28A, the inner peripheral upper support member 28B, and the outer peripheral support member 28C, any one may be covered with a coating layer, and any one may be exposed. By changing the support member covered with a coating layer, the amount of carbon supplied during film forming can be adjusted.

Figure 11:
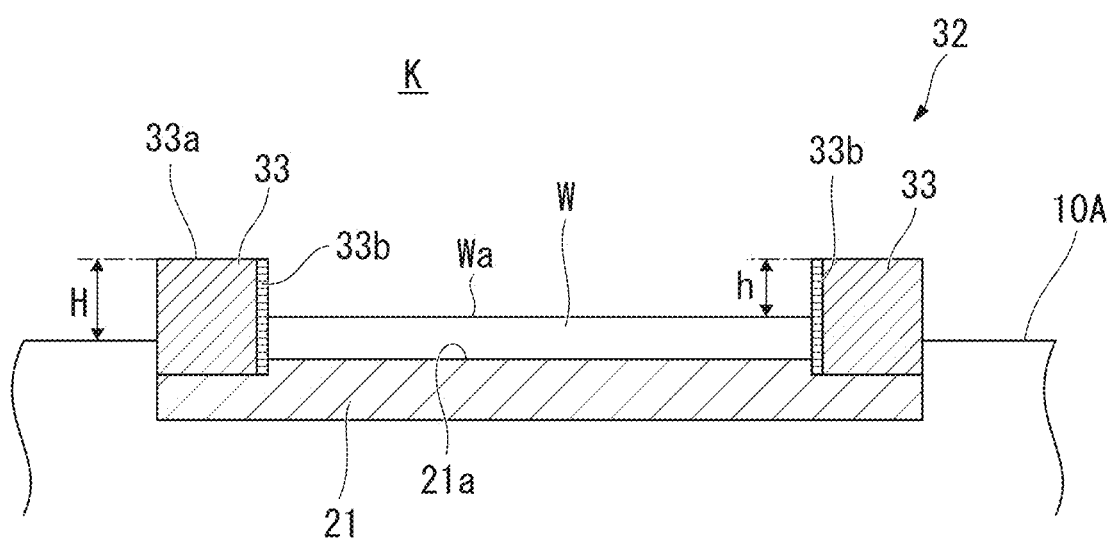
FIG. 11 is a schematic cross-sectional view showing a wafer support according to a seventh embodiment of the present invention.

FIG. 11 shows a wafer support according to a seventh embodiment of the present invention. A wafer support 32 according to this embodiment includes: the wafer mounting portion 21; and a ring-shaped wafer support portion 33 that is provided in an outer peripheral portion of the wafer mounting portion 21. The entire surface of the wafer support portion 33 is formed of graphite and is covered with a coating layer. However, a plurality of coating layer-removed portions 33b having a shape of a straight line, a horizontal line, a vertical line, a sequence of points, or the like may be formed inside the wafer support portion 33 such that graphite is partially exposed.

By adjusting the graphite-exposed portion using this structure, the amount of carbon supplied during film forming can be adjusted to a desired value.

Figure 12:
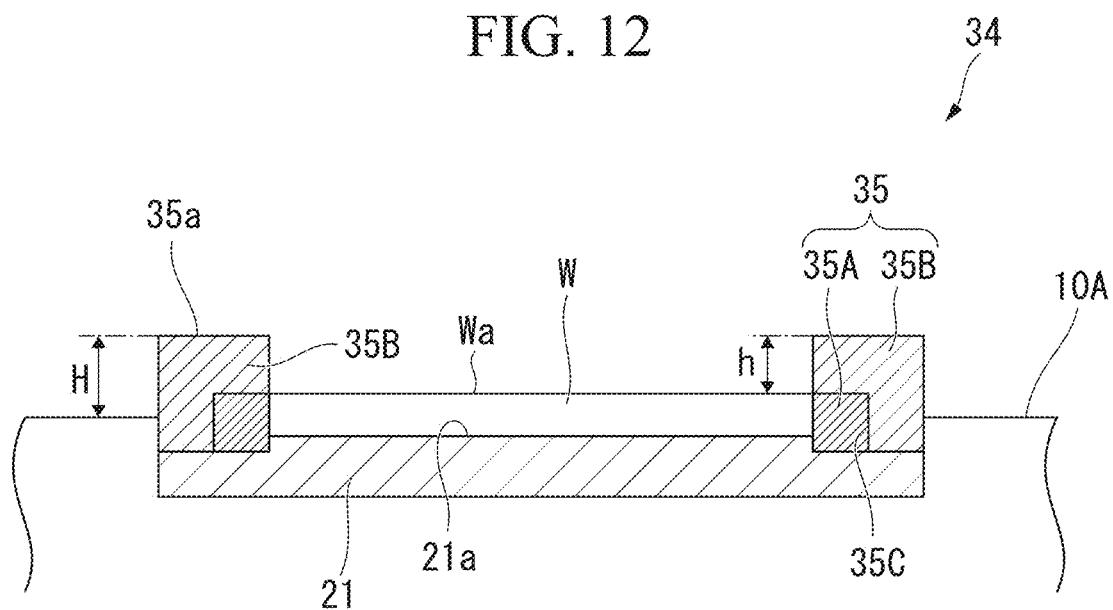
FIG. 12 is a schematic cross-sectional view showing a wafer support according to an eighth embodiment of the present invention.

FIG. 12 shows a wafer support according to an eighth embodiment of the present invention. A wafer support 34 according to this embodiment includes: the wafer mounting portion 21; and a ring-shaped wafer support portion 35 that is provided in an outer peripheral portion of the wafer mounting portion 21. The wafer support 35 includes: a ring-shaped inner peripheral lower support member 35A that is formed of graphite and is provided in an inner peripheral lower portion of the wafer support 35; and an outer peripheral support member 35B that is formed of graphite and is provided so as to cover an upper portion and an outer periphery of the inner peripheral lower support member 35A. An inner peripheral step portion 35C is formed on an inner peripheral lower portion of the outer peripheral support member 35B, and the inner peripheral lower support member 35A is integrated so as to be fitted to the inner peripheral step portion 35C.

In this structure, for example, the inner peripheral lower support member 35A is covered with a coating layer formed of TaC or SiC and graphite on the entire surface of the outer peripheral support member 35B is exposed such that carbon can be supplied from only the outer peripheral support member 35B.

In addition, for example, the outer peripheral support member 35B is covered with a coating layer formed of TaC or SiC and graphite on the entire surface of the inner peripheral lower support member 35A is exposed such that carbon can be supplied from only the inner peripheral lower support member 35A.

Figure 13:
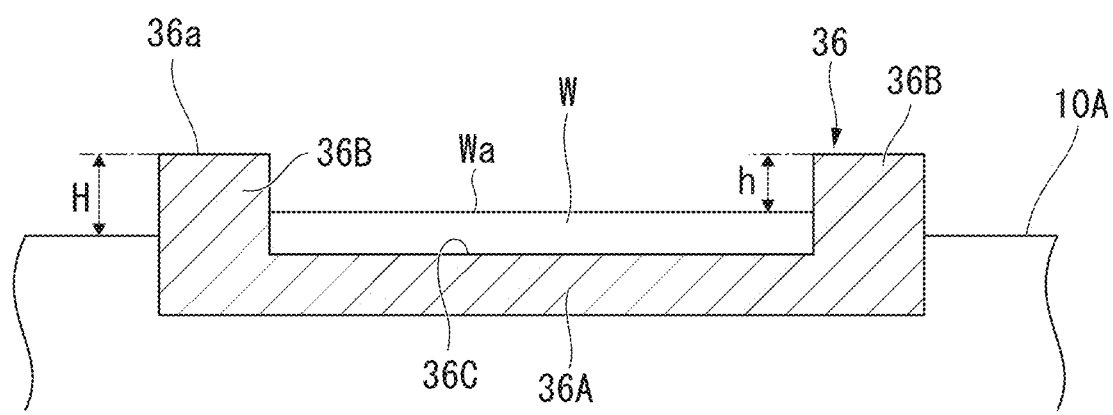
FIG. 13 is a schematic cross-sectional view showing a wafer support according to a ninth embodiment of the present invention.

FIG. 13 shows a wafer support according to a ninth embodiment of the present invention. The entire portion of a wafer support 36 according to this embodiment is formed of graphite, in which the wafer mounting portion 21 used in the above-described embodiments is integrated with a ring-shaped outer peripheral support member provided in an outer peripheral portion of the wafer mounting portion 21. That is, the wafer support 36 includes: a disk-shaped wafer mounting portion 36A; and a ring-shaped wafer support portion 36B that is integrated with an outer peripheral portion of the wafer mounting portion 36A. An upper surface of the wafer mounting portion 36A functions as a wafer installing surface 36C, and the above-described height h is defined by an upper surface 36a of the wafer support portion 36B.

In the configuration shown in FIG. 13, the entire portion of the wafer support 36 is formed of graphite. Therefore, this structure is preferable in a case where a larger amount of carbon than those of the above-described embodiments is supplied.

As described above, the wafer support can adopt various embodiments.

In addition, the shape of a cross-section of the B-B' surface of the wafer support portion according to any one of the above-described embodiments is not necessarily a quadrangular shape shown in FIGS. 8 to 13 and may be a triangular shape.

(Epitaxial Wafer)

Figure 14:
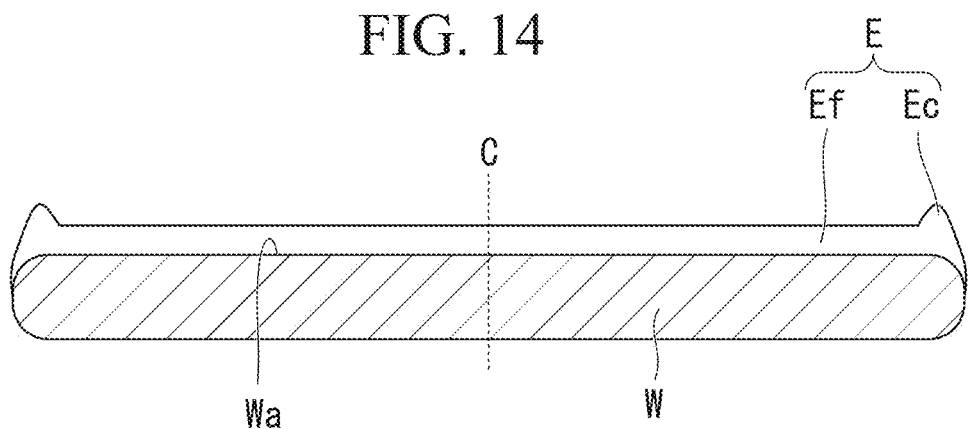
FIG. 14 is a schematic cross-sectional view showing a cross-section passing through the center of an epitaxial wafer having an edge crown.
Figure 15:
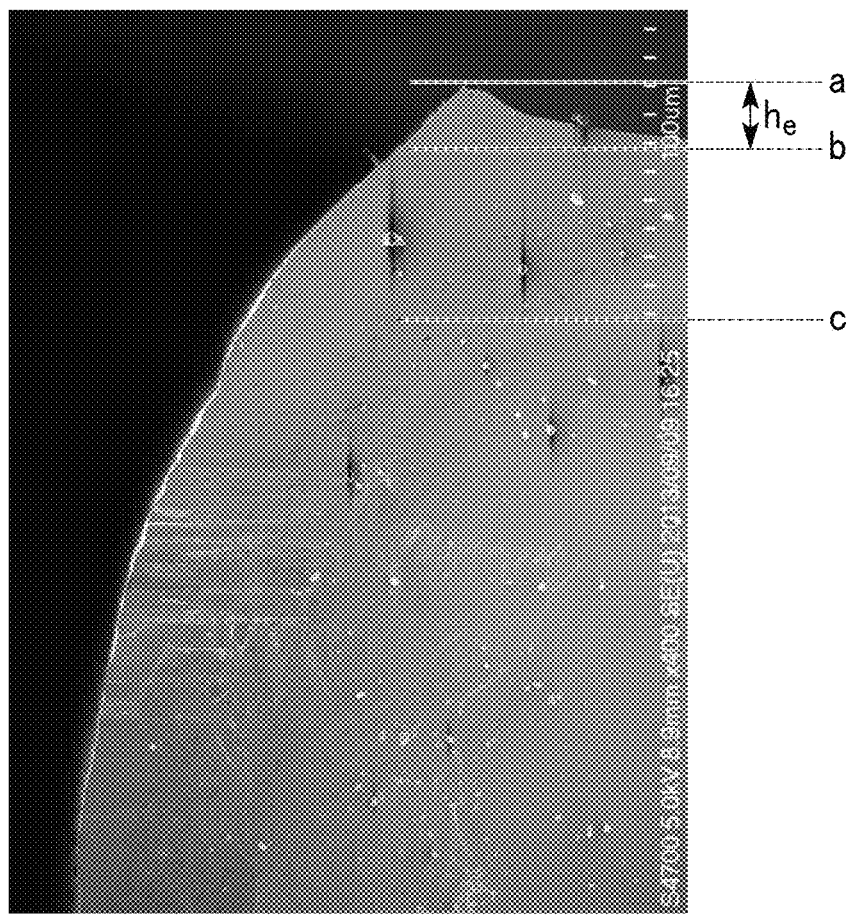
FIG. 15 is an enlarged cross-sectional scanning electron microscopic (SEM) image showing a wafer peripheral portion on which an edge crown is formed.

FIG. 14 is a schematic cross-sectional view showing a case where an epitaxial film having a flat portion and an edge crown is formed on a wafer. In addition, FIG. 15 is an enlarged scanning electron microscopic (SEM) image (cross-sectional SEM image) showing a cross-section of an epitaxial wafer peripheral portion on which the edge crown is formed. As shown in FIG. 14, the epitaxial film E is laminated on the wafer W. The epitaxial film E has the flat portion Ef and the edge crown Ec. Basically, the epitaxial film E is formed flat, the thickness of the flat portion Ef is substantially uniform, which is within a range of ±5% with respect to the thickness at a center C. On the other hand, the height of the edge crown Ec is in a range of 40% or higher and lower than 100% with respect to the thickness of the wafer center. Here, the height of the edge crown refers to a height $h_e$ from a level surface (line b in FIG. 15) of the epitaxial layer on the main surface to a top surface or apex (line a in FIG. 15) of the edge crown. The level surface is an ideal surface formed by the epitaxial wafer which is a standard. Originally, it is ideal that the thickness of the epitaxial film is the same in the center and in the other portions. The level surface refers to, in a case where the main surface of the wafer is used as the standard, a surface which is distant from the main surface (line c in FIG. 15) by the thickness of the epitaxial film in the center of the wafer, the main surface being the outermost surface of the substrate wafer. That is, in other words, "the height from the level surface to the top surface (apex) of the edge crown" refers to the width of a vertical line from the top surface (apex) of the edge crown to the level surface of the wafer. In a case where an end portion of the substrate wafer is chamfered, even when the top surface (apex) of the edge crown is present on a surface of an epitaxial layer which is grown on the chamfered portion, the surface of the portion may be set as the top surface (apex) of the edge crown such that the extrapolated distance from the top surface (apex) to the level surface of the epitaxial layer on the main surface can be obtained as the height of the edge crown.

In addition, the wafer peripheral portion refers to the periphery of the wafer which has a large effect on the preparation of a device. In a case where an OF is formed on the wafer, a portion having a given width is removed from the vicinity of the OF during the preparation of a device, and thus the edge crown has substantially little effect on the product quality. Therefore, the wafer peripheral portion may not include "the OF portion".

In a case where the edge crown Ec is present, the width of the edge exclusion zone increases, and the effective area ratio which can be achieved in a semiconductor chip decreases. In addition, the edge crown Ec may cause various defects. Further, in a case where the height is large, there is an inconvenience in the device forming process. Here, the thickness refers to the thickness of the epitaxial film in a direction perpendicular to the main surface Wa of the wafer W. The thickness and the height of the edge crown can be measured from a cross-sectional SEM image as shown in FIG. 15.

Figure 16:
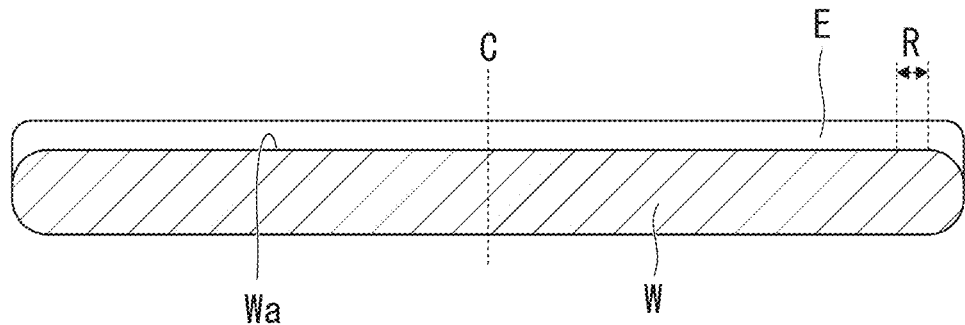
FIG. 16 is schematic cross-sectional view showing an arbitrary cross-section passing through the center of an epitaxial wafer which is manufactured using the chemical vapor phase growth device including the wafer support according to any one of the first to ninth embodiments of the present invention.

FIG. 16 is schematic cross-sectional view showing an arbitrary cross-section passing through the center of an epitaxial wafer which is manufactured using the chemical vapor phase growth device including the wafer support according to any one of the first to ninth embodiments of the present invention.

The epitaxial wafer according to the embodiment includes the epitaxial film E on the main surface Wa of the wafer W. The height of the edge crown is within 30% with respect to the thickness of the epitaxial film at a wafer center C.

Figure 17:
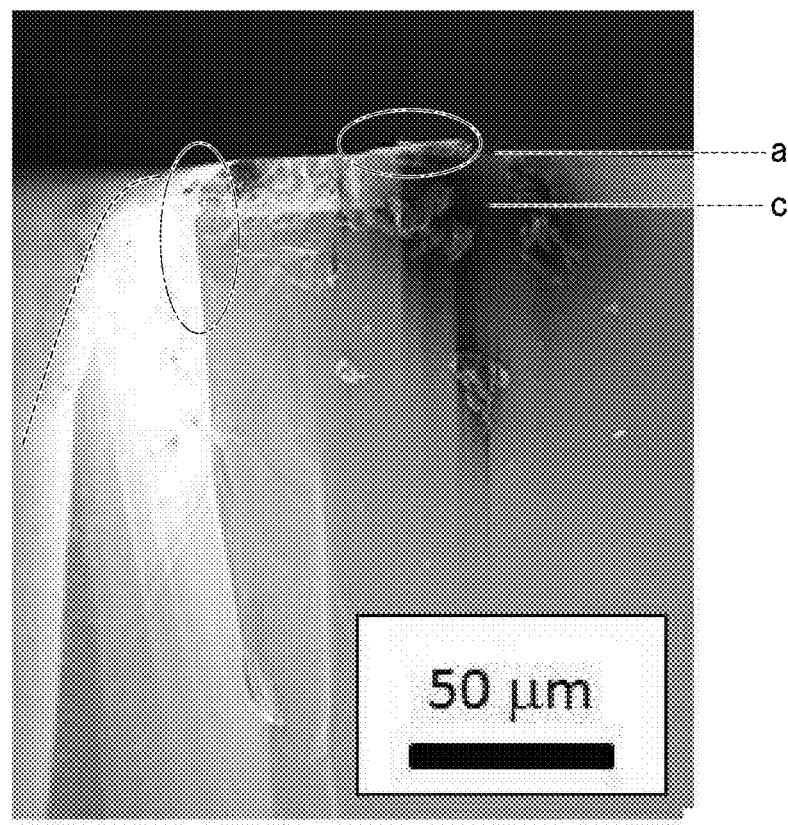
FIG. 17 is an enlarged scanning electron microscopic (SEM) image showing a cross-section of a peripheral portion of the epitaxial wafer according to the embodiment.

FIG. 17 is an enlarged scanning electron microscopic (SEM) image showing a cross-section of a peripheral portion R of the epitaxial wafer according to the embodiment. The imaged portion is not an OF portion of the wafer but a peripheral portion on which an OF is not formed. End portions of the wafer are slightly chamfered. Therefore, corner portions of the surface are rounded. In the image shown in FIG. 17, it is difficult to visually recognize the peripheral portion on the image, and thus a position corresponding to the peripheral portion is indicated by a dotted line.

The surface of the wafer peripheral portion is positioned on an extended line of the level surface as the main surface, the height of the edge crown is 0, and the formation of the edge crown is suppressed. In FIG. 17, a portion surrounded by a chain line refers to not the edge crown but a convex-concave portion or the like which is formed during cleaving. SiC single crystal is extremely hard, and thus such a convex-concave portion may be found during cleaving. However, it can be determined that the convex-concave portion is not the edge crown by observation while changing the magnification and the like.

The thickness of the epitaxial film at the wafer center is preferably 30 μm or more. In a case where the thickness of the epitaxial film is 30 μm or more, a high-voltage device can be manufactured.

This configuration is preferable particularly in a device which is manufactured using an epitaxial film formed of SiC because it requires high voltage resistance.

The epitaxial film E is not particularly limited and may be formed of Si, SiC, or a group III-V compound. The wafer W is also not particularly limited. However, in particular, the present invention is preferably applicable to SiC epitaxial growth in which the growth temperature is high and the growth pressure is low.

Hereinabove, the preferred embodiments of the present invention have been described. However, the present invention is not limited to a specific embodiment, and various modifications and changes can be made within the scope of the present invention described in the claims.

EXAMPLES

Hereinafter, the effects of the present invention will be clarified using Examples. The present invention is not limited to the following Examples, and appropriate changes can be made within a range not departing from the scope of the present invention.

Example 1

As a wafer, a 4-inch (0001) Si-face 4° off-axis SiC substrate having a thickness of 350 μm in which an OF is provided was used. This wafer was mounted on a wafer support in a planetary chemical vapor phase growth device. At this time, a ring-shaped member as a wafer support portion was disposed around the wafer. The thickness of the ring-shaped member was 2 mm. A cross-section of the ring-shaped member was quadrangular, and a height from a reaction space side-upper surface of the ring-shaped member to a main surface of the wafer mounted on the wafer mounting surface was 1.65 mm. In the ring-shaped member, a linear portion was provided at a position corresponding to the OF portion of the wafer such that the inside of the ring-shaped member is disposed along the periphery of the wafer. The distance between the wafer periphery and the ring-shaped member was 0.15 μm.

As a raw material gas, a mixed gas of silane and propane was used, hydrogen gas was used as a carrier gas, and these gases are supplied to a portion of the wafer corresponding to the center under conditions of growth pressure: 15 kPa, growth temperature: 1600° C., and flow rate: 2 m/s.

Under the above-described conditions, an epitaxial film having a thickness of 30 μm was grown on a flat portion, and the height of an edge crown formed at this time was measured. As a result, the height of the edge crown formed on the OF surface of the SiC substrate was 6 μm, and the thickness of the edge crown in an outer peripheral surface other than the OF surface was the same at 6 μm.

Example 2

The thickness of the edge crown was measured under the same conditions as those in Example 1, except that the internal shape of the ring-shaped member was circular and an OF portion was not provided.

As a result, the height of the edge crown formed on the OF surface of the SiC substrate was 24 μm, and the height of the edge crown in an outer peripheral surface other than the OF surface was 8 μm.

Example 3

The thickness of the edge crown was measured under the same conditions as those in Example 2, except that a SiC substrate having a thickness of 500 μm was used as the wafer.

As a result, the height of the edge crown formed on the OF surface of the SiC substrate was 32 μm, and the thickness of the edge crown in an outer peripheral surface other than the OF surface was 9 μm.

Examples 4 to 6

The thicknesses of the edge crowns were measured respectively under the same conditions as those of Examples 1 to 3, except that the thickness of the ring-shaped member was changed to 4 mm.

In Example 4, no edge crown was found.

In Example 5, no edge crown was found in regions other than the OF portion.

In Example 6, no edge crown was found in regions other than the OF portion. The thickness of the edge crown formed on the OF surface of the SiC substrate was 20 μm, and the thickness of the edge crown in an outer peripheral surface other than the OF surface was 0 μm.

Comparative Examples 1 to 3

The thicknesses of the edge crowns were measured respectively under the same conditions as those of Examples 1 to 3, except that the thickness of the ring-shaped member was changed to 1 mm.

In Comparative Example 1, the thickness of the edge crown formed on the OF surface of the SiC substrate was 13 μm, and the thickness of the edge crown in an outer peripheral surface other than the OF surface was 13 μm.

In Comparative Example 2, the thickness of the edge crown formed on the OF surface of the SiC substrate was 29 μm, and the thickness of the edge crown in an outer peripheral surface other than the OF surface was 13 μm.

In Comparative Example 3, the thickness of the edge crown formed on the OF surface of the SiC substrate was 50 μm, and the thickness of the edge crown in an outer peripheral surface other than the OF surface was 20 μm.

The results of Examples 1 to 6 and Comparative Examples 1 to 3 are collectively shown in Table 1.

TABLE 1

|  | Thickness of Wafer (μm) | Thickness of Wafer Support Portion (mm) | Height from Upper Surface of Wafer Support Portion to Main Surface of Wafer (mm) | Thickness of Epitaxial Film at Wafer Center (μm) | Height of Edge Crown in Outer Peripheral Portion (μm) | Height of Edge Crown in OF Portion (μm) |
|---|---|---|---|---|---|---|
| Example 1 | 350 | 2 | 1.65 | 30 | 6 | 6 |
| Example 2 | 350 | 2 | 1.65 | 30 | 8 | 24 |
| Example 3 | 500 | 2 | 1.5 | 30 | 9 | 32 |
| Example 4 | 350 | 4 | 3.65 | 30 | 0 | 0 |
| Example 5 | 350 | 4 | 3.65 | 30 | 0 | 22 |
| Example 6 | 500 | 4 | 3.5 | 30 | 0 | 20 |
| Comparative Example 1 | 350 | 1 | 0.65 | 30 | 13 | 13 |
| Comparative Example 2 | 350 | 1 | 0.65 | 30 | 13 | 29 |
| Comparative Example 3 | 500 | 1 | 0.5 | 30 | 20 | 50 |

It can be seen from Table 1 that, as the height from the upper surface of the wafer support portion to the wafer main surface increases, the thickness of the edge crown decreases. In addition, it can be seen that, in Examples 1 to 6 in which the height from the upper surface of the wafer support portion to the wafer main surface was 1 mm or more, the edge crown was suppressed in regions other than the OF portion, and the height of the edge crown was within 30% with respect to the thickness at the wafer center as compared to Comparative Examples 1 to 3. In addition, the inside of the ring-shaped member is disposed along the periphery of the wafer. Therefore, the height of the edge crown was able to be suppressed over the entire edge portion of the wafer.

Example 7

In Example 7, first, a C face of a SiC substrate (6 inches, 4H-SiC-4° off substrate) was set as a main surface, lap polishing was performed thereon using a diamond slurry having an average secondary particle size of 0.25 μm, and CMP polishing was further performed.

During SiC epitaxial growth on a C surface, the carrier concentration was largely affected by the C/Si ratio, and thus the carrier concentration distribution was large. At this time, the C-face wafer was used in order to more distinctly show the effect of improving the carrier concentration distribution obtained by the carbon member.

Next, a SiC epitaxial film having a thickness of 5 μm was grown on the polished main surface (C surface) of the SiC substrate using the manufacturing device (CVD film forming device) shown in FIG. 1. At this time, the SiC substrate was mounted on the wafer support (satellite) provided on the mounting plate, and the raw material gas was supplied together with the carrier gas while allowing the SiC substrate to revolve and rotate.

In addition, regarding film forming conditions at this time, the growth temperature was 1600° C., the carrier gas was hydrogen, the dopant gas was nitrogen, the C raw material gas was propane, the Si raw material gas was silane, and the C/Si ratio was 1.1.

In this Example, the wafer support shown in FIG. 8 was used. That is, in this structure, the ring-shaped wafer support portion 22 was provided on the wafer support. In addition, the wafer support 20 was formed of ultra high purity graphite. In the wafer support 20, the wafer mounting portion 21 was covered with a coating layer formed of SIC, and graphite thereon was not exposed. The wafer support portion 22 had a ring-shaped structure having a carbon supply source in which ultra high purity graphite was exposed. That is, the wafer support portion 22 had a structure in which the upper surface was formed of SiC and graphite was present below the upper surface. A cross-section of the ring-shaped member was quadrangular, and a height from a reaction space side-upper surface of the ring-shaped member to a main surface of the wafer mounted on the wafer mounting surface was 1.65 mm. In the ring-shaped member, a linear portion was provided at a position corresponding to the OF portion of the wafer such that the inside of the ring-shaped member is disposed along the periphery of the wafer. The distance between the wafer periphery and the ring-shaped member was 0.15 μm.

A commercially available ultra high purity graphite includes, as impurities, 0.1 ppm wt of B, 0.001 ppm wt or lower of Mg, 0.001 ppm wt or lower of Al, 0.001 ppm wt or lower of Ti, 0.001 ppm wt or lower of V, 0.004 ppm wt or lower of Cr, 0.02 ppm wt or lower of Fe, and 0.001 ppm wt or lower of Ni, and nitrogen is removed therefrom by baking. Therefore, substantially no elements other than carbon were supplied.

Regarding the SiC epitaxial wafer obtained in the above-described procedure in which the SiC epitaxial wafer was formed on the main surface of the SiC substrate, the carrier concentration was measured using a CV measuring device at a pitch of 10 mm in a radial direction of the SiC epitaxial wafer in the following order: outer peripheral end portion→center→outer peripheral end portion. The results are shown in the graphs in FIGS. 18A and 18B.

Figure 18A:
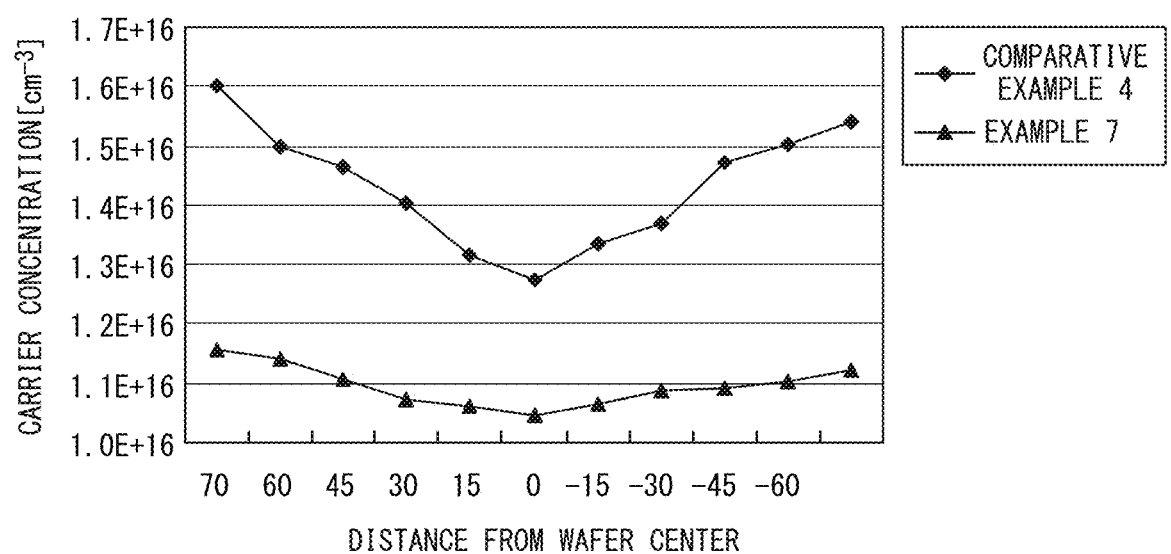
FIG. 18A is a graph showing a carrier concentration distribution in a radial direction of a SiC epitaxial wafer regarding each of Examples 7 and Comparative Example 4 of the present invention.
Figure 18B:
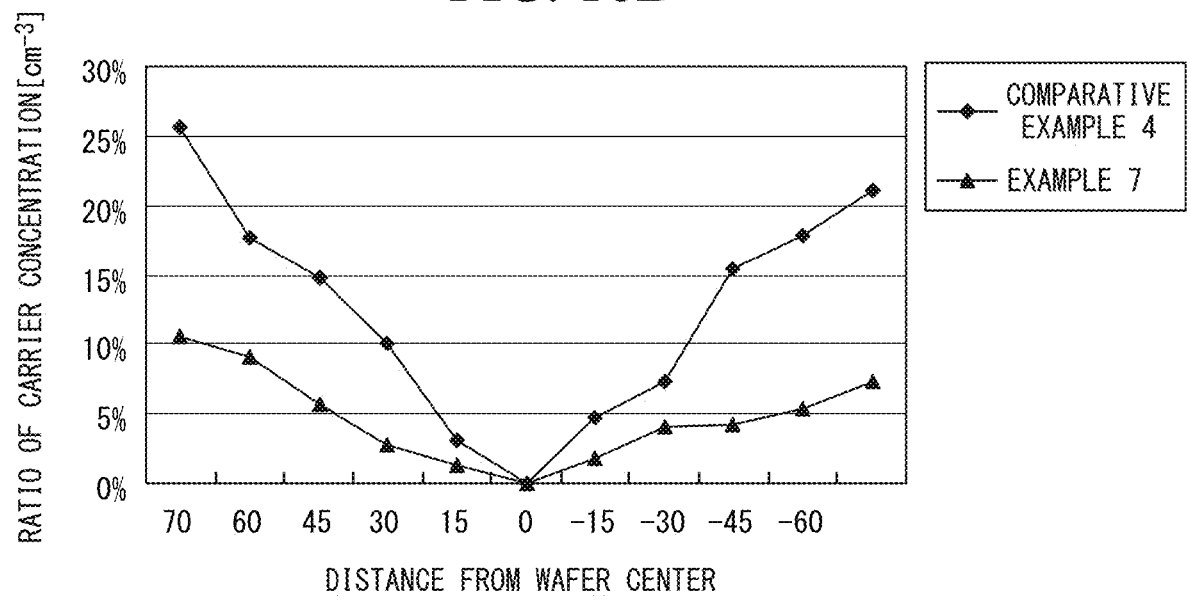
FIG. 18B is a graph showing a ratio of a carrier concentration in the radial direction of the SiC epitaxial wafer to a carrier concentration in the wafer center regarding each of Examples 7 and Comparative Example 4 of the present invention.

FIG. 18A is a graph showing the carrier concentration distribution in the radial direction of the SiC epitaxial wafer. FIG. 18B is a graph showing a ratio of the carrier concentration in the radial direction of the SiC epitaxial wafer to the carrier concentration in the wafer center.

Comparative Example 4

In Comparative Example 4, a SiC epitaxial wafer was prepared using the same procedure and conditions as those of Example 7, except that, in the manufacturing device, the entire surface of the ring as the wafer support portion 22 was formed of SiC, and no graphite-exposed portion was present.

Using the same method as that of Example 7, the carrier concentration of the SiC epitaxial wafer was measured at a pitch of 10 mm in the radial direction in the following order: outer peripheral end portion→center→outer peripheral end portion. The results are shown in the graphs in FIGS. 18A and 18B.

[Evaluation Results]

It can be seen from the graphs in FIGS. 18A and 18B that, in the SiC epitaxial wafer according to Example 7 which was obtained using the manufacturing device according to the present invention by forming the SiC epitaxial film on the main surface of the SiC substrate while supplying carbon to the upstream side of the raw material gas, the carrier concentration in the entire plane was more uniform than that of Comparative Example 4.

Here, in Comparative Example 4, the carrier concentration was relatively low in the vicinity of the wafer center. However, the carrier concentration was extremely high in the wafer outer peripheral portion (vicinity of the edge), and the in-plane carrier concentration in the SiC epitaxial film was significantly non-uniform.

On the other hand, in Example 7, the variation in the carrier concentration was reduced as compared to that of Comparative Example 4. As shown in FIG. 18B, in Comparative Example 4, the variation in the carrier concentration (difference in carrier concentration between the center and the outer peripheral portion) was 25% or higher. On the other hand, in Example 7, the variation in the carrier concentration was about 10%.

In particular, in Example 7, the carrier concentration in the entire plane was controlled to be lower than that of Comparative Example 1. In particular, in the wafer outer peripheral portion, the carrier concentration was significantly reduced.

In the SiC epitaxial wafer manufactured in Example 7, the reason why the carrier concentration was reduced particularly in the outer peripheral portion is presumed based on the above results. By providing the wafer support portion formed of graphite on the upstream side of the raw material gas, that is, the vicinity of the wafer and forming the SiC epitaxial film under conditions where carbon was supplied from the wafer support portion, the C/Si ratio was increased in the wafer outer peripheral portion provided on the upstream side of a gas flow, and thus the carrier concentration at this position was reduced.

REFERENCE SIGNS LIST

100: MANUFACTURING DEVICE
10: MOUNTING PLATE
10a, 10A: UPPER SURFACE OF MOUNTING PLATE
11: CONCAVE HOLDER
12: ROTATING SHAFT
13: ROTATING BASE
20, 25, 27, 32, 34, 36: WAFER SUPPORT
21, 36A: WAFER MOUNTING PORTION
21a, 36c: WAFER MOUNTING SURFACE
22, 26, 28, 33, 35, 36: WAFER SUPPORT PORTION
22a, 26a, 28a, 33a, 35a, 36a: UPPER SURFACE OF WAFER SUPPORT PORTION
23: RING-SHAPED MEMBER
30: GAS INTRODUCTION PIPE
31: GAS INTRODUCTION PORT
50: CEILING
60: PERIPHERAL WALL
70: INDUCTION COIL
G: RAW MATERIAL GAS
K: REACTION SPACE
W: WAFER
Wa: WAFER MAIN SURFACE
E: EPITAXIAL FILM
Ef: FLAT PORTION
Ec: EDGE CROWN
C: CENTER
R: PERIPHERAL PORTION

The invention claimed is:

1. A method of manufacturing a SiC epitaxial wafer in which a SiC epitaxial film is grown on a main surface of a SiC substrate using a chemical vapor deposition method, the method comprising steps of:
using a chemical vapor phase growth device comprising a mounting plate that comprises a concave holder, and a wafer support that is disposed in the concave holder, that has a wafer mounting surface having an upper surface on which a SiC substrate is mounted, and that has a wafer support portion that rises to surround the SiC substrate, and
forming the SiC epitaxial film on the SiC substrate while forming a flow of a raw material gas, which passes a region above the wafer support portion and reaches the main surface of the SiC substrate,
wherein a height from a portion of a reaction space side-upper surface of the wafer support portion, which is most distant from the wafer mounting surface, to a main surface of the SiC substrate is 1 mm or more, and
wherein an interval between the wafer support portion and an outer peripheral surface of the SiC substrate mounted on the wafer mounting surface is designed to be 0.1 mm to 0.5 mm.

2. The method of manufacturing a SiC epitaxial wafer according to claim 1,
wherein a flow rate of gas which is supplied to the main surface of the SiC substrate mounted on the wafer support is 0.1 m/s to 10 m/s.

* * * * *